(12) United States Patent
Choi et al.

(10) Patent No.: US 8,020,805 B2
(45) Date of Patent: Sep. 20, 2011

(54) HIGH ALTITUDE AIRSHIP CONFIGURATION AND POWER TECHNOLOGY AND METHOD FOR OPERATION OF SAME

(75) Inventors: Sang H. Choi, Poquoson, VA (US); James R. Elliott, Jr., Yorktown, VA (US); Glen C. King, Yorktown, VA (US); Yeonjoon Park, Yorktown, VA (US); Jae-Woo Kim, Newport News, VA (US); Sang-Hyon Chu, Newport News, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 968 days.

(21) Appl. No.: 11/831,233

(22) Filed: Jul. 31, 2007

(65) Prior Publication Data
US 2009/0072078 A1 Mar. 19, 2009

Related U.S. Application Data

(60) Provisional application No. 60/834,547, filed on Jul. 31, 2006.

(51) Int. Cl.
*B64B 1/06* (2006.01)
*B64B 1/02* (2006.01)

(52) U.S. Cl. ........................................................ 244/30
(58) Field of Classification Search .................. 244/24, 244/30, 31, 60, 96, 125, 126, 127
See application file for complete search history.

(56) References Cited

U.S. PATENT DOCUMENTS

| | | | | | |
|---|---|---|---|---|---|
| 4,085,912 | A | * | 4/1978 | Slater | 244/25 |
| 4,235,221 | A | * | 11/1980 | Murphy | 126/567 |
| 6,224,016 | B1 | * | 5/2001 | Lee et al. | 244/30 |
| 6,305,641 | B1 | * | 10/2001 | Onda | 244/30 |
| 6,425,552 | B1 | * | 7/2002 | Lee et al. | 244/97 |
| 2005/0242232 | A1 | * | 11/2005 | Bennett | 244/53 R |
| 2009/0272841 | A1 | * | 11/2009 | Sinsabaugh et al. | 244/30 |

* cited by examiner

*Primary Examiner* — Rob Swiatek
*Assistant Examiner* — Valentina Xavier
(74) *Attorney, Agent, or Firm* — Helen M. Galus; Thomas K. McBride, Jr.

(57) ABSTRACT

A new High Altitude Airship (HAA) capable of various extended applications and mission scenarios utilizing inventive onboard energy harvesting and power distribution systems. The power technology comprises an advanced thermoelectric (ATE) thermal energy conversion system. The high efficiency of multiple stages of ATE materials in a tandem mode, each suited for best performance within a particular temperature range, permits the ATE system to generate a high quantity of harvested energy for the extended mission scenarios. When the figure of merit 5 is considered, the cascaded efficiency of the three-stage ATE system approaches an efficiency greater than 60 percent.

12 Claims, 22 Drawing Sheets

HIGH ALTITUDE AIRSHIP CONFIGURATION AND POWER TECHNOLOGY AND METHOD FOR OPERATION OF SAME

Pursuant to 35 U.S.C. §119, the benefit of priority from provisional application 60/834,547, with a filing date of Jul. 31, 2006, is claimed for this non-provisional application.

ORIGIN OF THE INVENTION

This invention was made in part by employees of the United States Government and may be manufactured and used by or for the Government of the United States of America for governmental purposes without the payment of any royalties thereon or therefor.

BACKGROUND OF THE INVENTION

1. Field of the Invention

This invention generally relates to high altitude airship (HAA) configurations and operation. More specifically, the invention comprises new advanced thermoelectric (ATE) power technology, and new HAA configurations and methods for operation utilizing this new power technology.

2. Description of the Related Art

The applications and uses of HAAs are extensive and might include earth surveillance, such as for scientific and weather monitoring. Commercial applications include monitoring and controlling the ever-increasing complexities of aerial and maritime transportation and telecommunication networks. Such a scenario of HAA applications requires a substantial amount of power to operate surveillance systems, probes, sensors, telescopes, radar systems, etc. A large amount of power for the envisioned roles of HAAs requires onboard power generation or harvesting and storage systems. The propulsion and maneuverability of HAAs also requires a significant amount of power. The weight growth of HAA is limited by the long-term operation requirements and the limit on weight growth (possible lighter than air requirement). Accordingly, it can offer no room for fuel-carrying power generators which limit the operational time or otherwise increase the overall weight. The power technology for HAA maneuverability and mission-oriented applications must come, at least in part, from its surroundings, e.g. solar power.

There are a variety of known energy conversion technologies, including several for the harvesting of solar power. Conventional photovoltaic cells are used for many solar energy applications, in both commercial and private settings. Photovoltaic cells have been used for long duration airplanes, the solar-powered Pathfinder, and remotely piloted aircraft. Accordingly, solar power can be regarded as one of the power sources for airships. Additionally, the photovoltaic (PV) cell array has been widely used for satellite power sources. However, the cost, weight and photon energy coupled band-gap energy structure of high efficiency photovoltaic cells pose shortcomings for wide and unlimited applications. Another known energy conversion technology is the fuel cell, but it is a heavier, fuel-carrying power generation system. Thus, many potential solar power applications, including airships, can find photovoltaic cells and fuel cells difficult, or impossible, to use.

SUMMARY OF THE INVENTION

Accordingly, it is an object of the present invention to provide a thermoelectric energy conversion system that is lighter than many known systems.

Another object of the present invention is to provide a more efficient thermoelectric energy harvesting, conversion and storage system.

Another object of the present invention is to provide a configuration and method of operation for an HAA so as to optimize the harvesting of solar energy.

Another object of the present invention is to provide a new efficient HAA configuration, power transmission and power storage system.

Another object of the present invention is to provide a method of operation for a new HAA configuration, energy generator and power storage system.

Another object of the present invention is to provide an HAA configured and powered to permit long term operation.

Other objects and advantages of the present invention will become more obvious hereinafter in the specification and drawings.

In accordance with the present invention, these objects and their attending benefits are achieved by providing an airship having an elliptical cross-section, utilizing advanced thermoelectric technology for converting solar energy incident thereon, and which airship is configured and operated in a manner to maximize the collection of such solar energy. The advanced thermoelectric technology comprising a plurality of thermoelectric layers in a tandem mode, each layer being suited for best performance within a particular temperature range, and at least one of these layers comprises an advanced thermoelectric material, and whereby these layers provide a cascaded efficiency.

BRIEF DESCRIPTION OF THE DRAWINGS

For a more complete understanding of the present invention, including other objects and advantages, reference should be made to the Detailed Description of the Invention set forth below. This Detailed Description should be read together with the accompanying drawings, wherein.

DETAILED DESCRIPTION OF THE INVENTION

The present invention comprises advanced thermoelectric (ATE) power technology for new configuration high altitude airships, and methods for operation of same. This multi-layer advanced thermoelectric energy conversion system can be used for a variety of energy conversion applications, including both energy production and cooling. One advantageous embodiment of the present inventive system, or device, is based on advanced thermoelectric (ATE) materials which can be developed for a targeted figure of merit (FoM) goal, advantageously, greater than 5. This inventive power technology, when used in conjunction with the present inventive HAA configuration enables many application specific scenarios which might not have been possible with prior technology.

Figure 1:
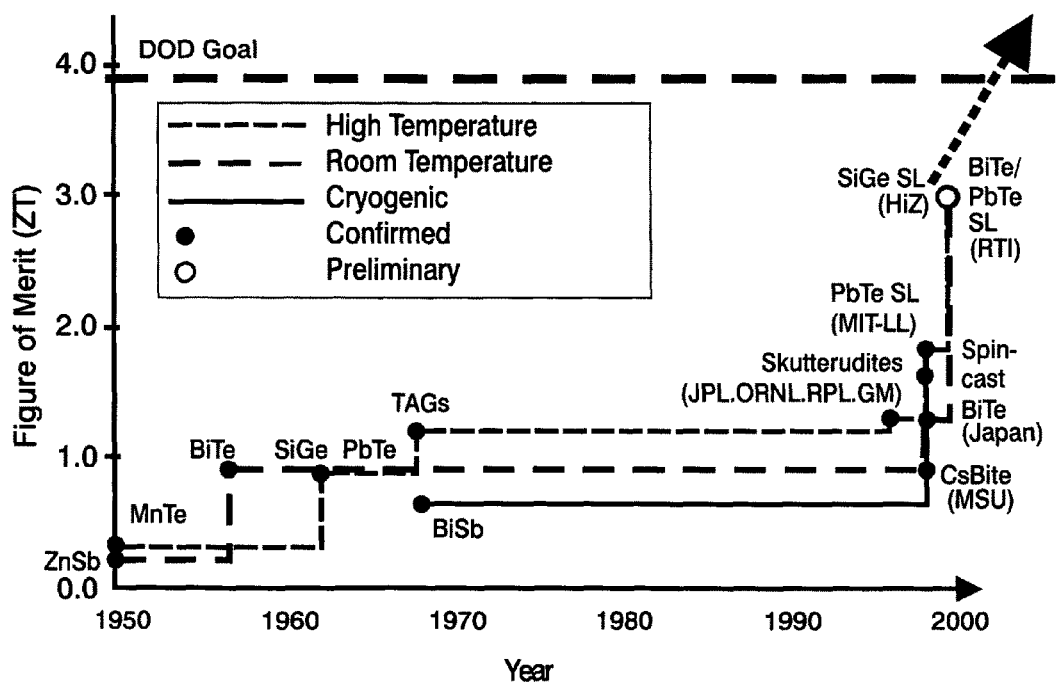
FIG. 1 is a graph depicting the History of Thermoelectric Figure of Merit (ZT)
Figure 2:
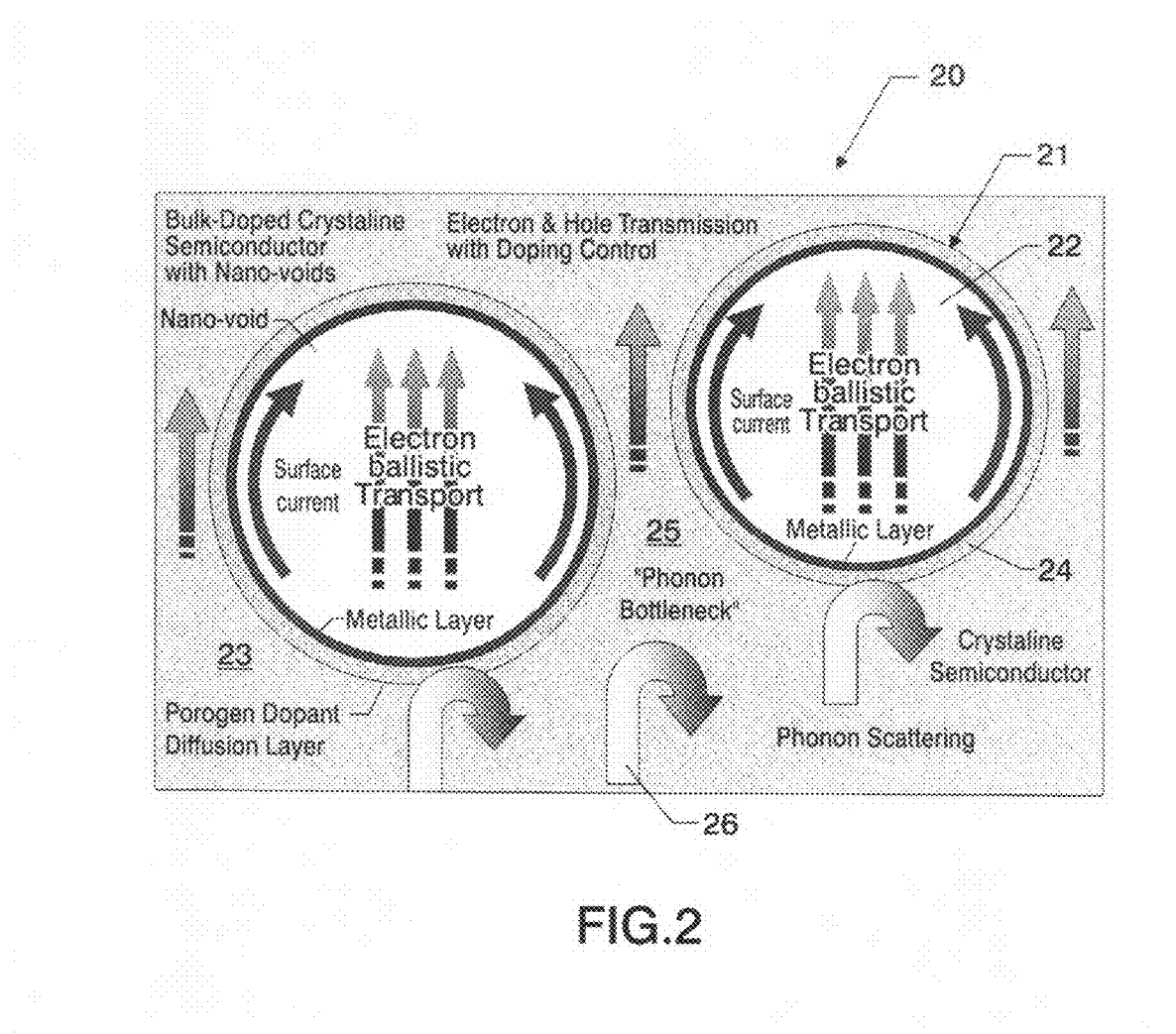
FIG. 2 is an illustration of a morphological design of an advanced thermoelectric material to enhance the ZT by increasing electrical conductivity while suppressing thermal conductivity by populating nanovoids into the material, which material can be utilized in at least one embodiment of the present invention.

As shown in FIG. 1, the FoMs of most TE materials developed to date are still below 2. A FoM of 1 is equivalent to a thermal to electrical energy conversion efficiency greater than 6%. To achieve advanced TE (ATE) materials 20 with a high FoM, nanovoids 21 can be incorporated, as shown in FIG. 2, into the TE materials 23 to increase the electrical conductivity (EC) while reducing the thermal conductivity (TC). The nanovoids 21 are essentially nano spherical shells 24 having internal voids 22. In one embodiment, spherical shells 24 of approximately 10 nm to approximately 20 nm in outer diameter can be made from a metallic component such as gold or cobalt using a bio-template, as discussed in more detail below. The void 22 inner diameter can range from approximately 10 nm to approximately 12 nm. The void diameter needs to be small enough to avoid a reduction in electrical conductivity and a change in morphology of the bulk material to poly-crystalline.

Typically, within a crystalline structure of a material, the heat transfer mechanism is mainly dictated by phonon transmission (>70%) rather than by energetic electrons (<30%) at temperatures below 900 K. Accordingly, a method to manipulate the phonon transmission within a crystalline medium offers a capability to control the thermal conductivity. The metallic nanovoids 21 populated inside bulk matrix TE materials 23 create large phonon scattering cross-sections that effectively block the transfer of thermal energy through them. The TE material 23 in an unoccupied area 25 that is sandwiched between nanovoids 21 will become a phonon 26 bottleneck since the narrowly sandwiched bulk material is under a high tension induced from the spherical formation of the TE material boundary around the nanovoids, as shown in FIG. 2. The structure of the TE material boundary surface around the spherical nanovoids 21 may be framed of a high energy bonding group that develops high tension over the surface. The material structure with high tension would be less subjected to an oscillatory mode transmission than material structures in normal tension. Therefore, both the high tension and the narrow passage 25 between nanovoids are resistive to phonon transmission and accordingly regarded as a phonon bottleneck. Ultimately, the imbedded nanovoids 21 create the phonon scattering cross-sections and bottlenecks throughout the matrix material as shown in FIG. 2.

Figure 3:
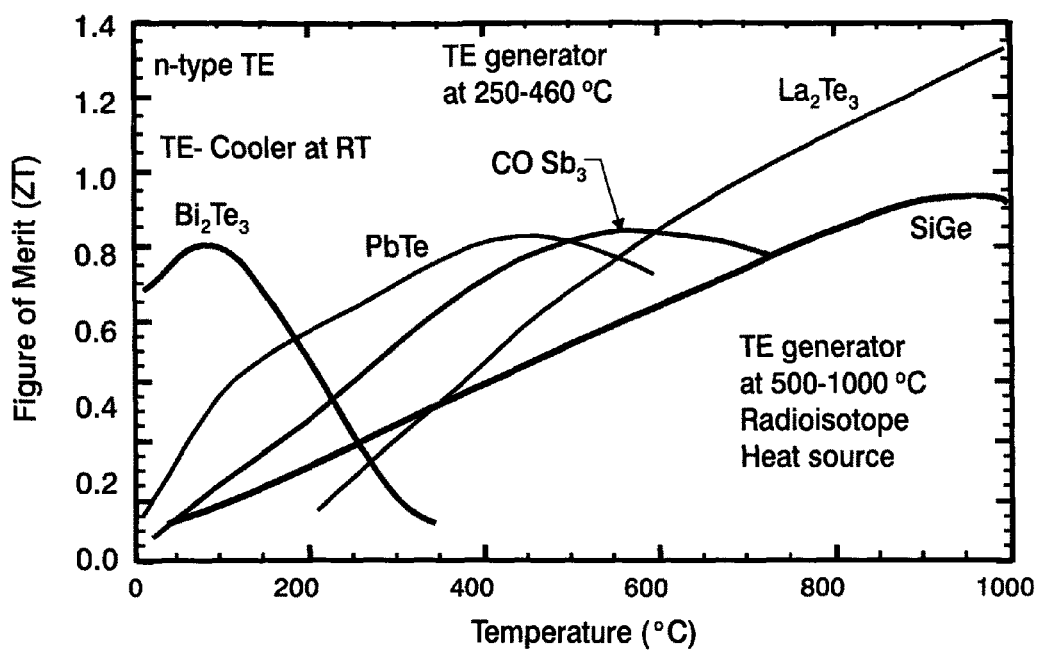
FIG. 3 is a graph of the figure of merit of several TE materials which could be utilized in at least one embodiment of the present invention.

The selection basis of TE materials for the present invention can be according to the temperature at which the performance of the particular TE material is best-suited. For example, in at least one advantageous embodiment of the present invention, the materials selected can be silicon-germanium (SiGe) and bismuth telluride ($Bi_2Te_3$), along with lead telluride (PbTe). Currently pending U.S. patent application Ser. No. 11/242,415, entitled "Silicon Germanium Semiconductive Alloy and Method of Fabricating Same, by Park, et al., filed on Sep. 27, 2005, and hereby incorporated by reference as if set forth in its entirety herein, discloses additional detail relative to a lattice-matched silicon germanium semiconductive alloy and its fabrication that is suitable for use in at least one layer of the present invention. Materials desirable for use would also include nanovoid-imbedded forms of Si Ge, PbTe, and $Bi_2Te_3$ Nanovoid-imbedded Bi—Te would be suitable for use in one or more different layers. Bismuth Telluride is currently used in solid-state TE cooling devices due to its high figure of merit at room temperature, as shown in FIG. 3, but its applications are still limited by poor TE properties. To improve TE performance, nanometer-scale voids can be incorporated into Bi—Te material, with the void size, size distribution, void location, etc. controlled under various process conditions. The nanovoids reduce thermal conductivity by disrupting phonons without sacrificing electron transport, thereby allowing for the reduction of thermal conductivity while increasing electrical conductivity. The nanovoid incorporation is controlled by thermodynamic miscibility and kinetic mobility of two phases, TE precursor and voigen. Metal nanoparticles such as but not limited to gold, cobalt, platinum, manganese, and iron, anchored on the voigen material surface eventually form a metal layer or lining through an annealing process. The spherical void by metal lining becomes a passage of mobile electrons and aids the electrons to move through the nanovoid structure.

There are several methods for imbedding nanovoids into a matrix material. For example, in the solvo-thermal method which can be used for $Bi_2Te_3$, the nanocrystals of bismuth telluride are created and then mixed with nanovoids before solvent casting. Through solvent casting on a substrate after mixing, a cake of bismuth telluride is made. This cake goes through calcination and hydrogen plasma etching processes to remove unwanted impurity elements. Finally, the sponge form of bismuth telluride is sintered to become a matrix of single crystal deposition.

To date, the void-incorporated TE materials have been studied in several compound systems, such as bismuth, silicon, Si—Ge solid solutions, Al-doped SiC, strontium oxide and strontium carbonate. Si—Ge samples prepared by Pulverized and Intermixed Elements Sintering (PIES) method exhibited 30% increase in TE performance with 15-20% void fraction. Theoretical calculations also indicate that it is possible to increase the ZT of certain materials by a factor of several times their bulk values by preparing them in 1D or 2D nanostructures. Bi—Te materials, especially with low-dimensional system, have been fabricated through solvo-thermal method (1D or 2D nanocrystals), metal-organic chemical vapor deposition (MOCVD) (2D superlattice structure), electrodeposition in porous alumina substrates (1D nanowire), and reverse micelle method (0-D quantum dots).

Figure 4:
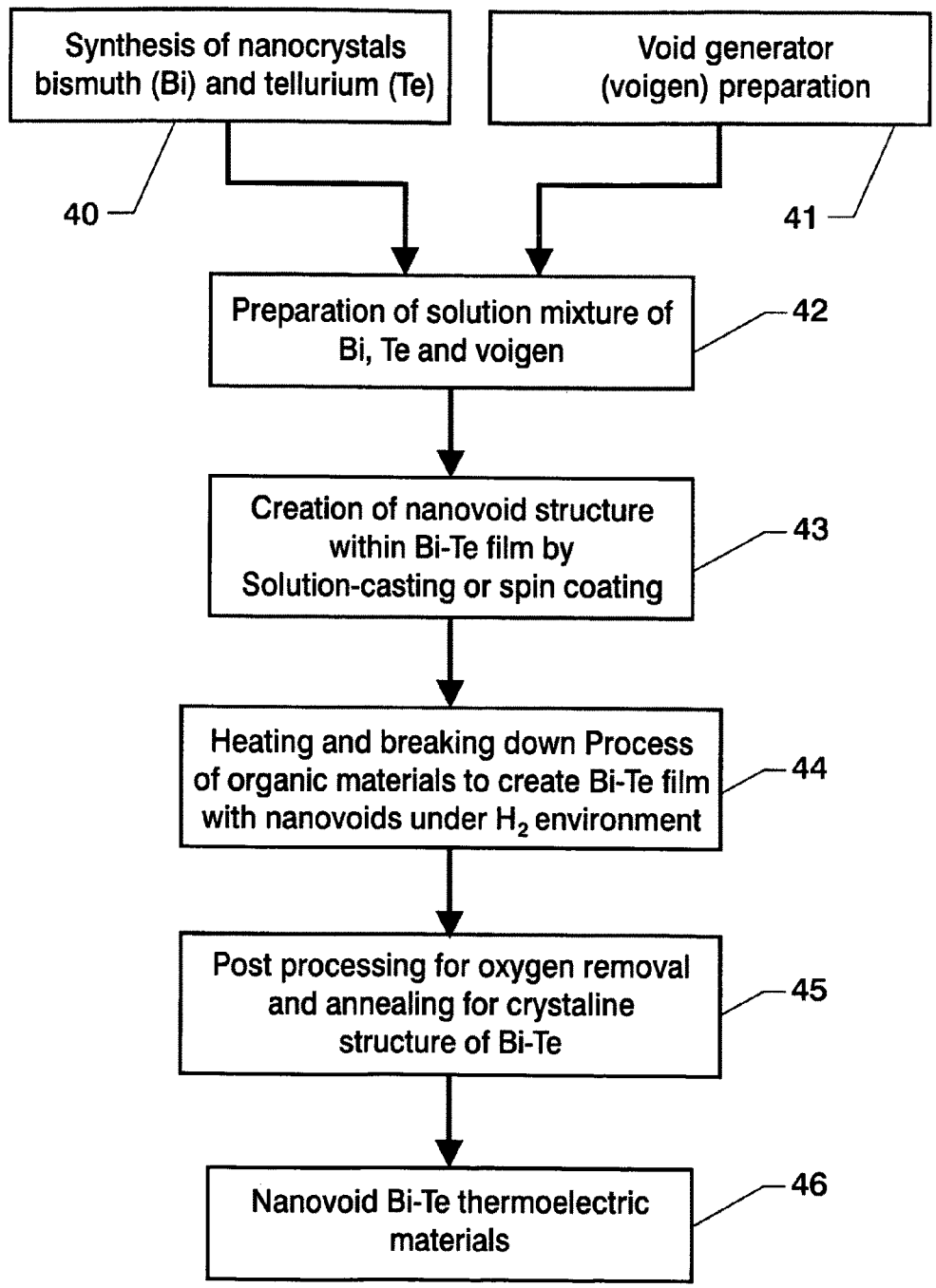
FIG. 4 is a flow chart of the fabrication of a nanovoid bismuth telluride (Bi—Te) thermoelectric material that could be utilized in at least one embodiment of the present invention.

Nanovoids are incorporated, in a controllable manner, into bismuth telluride (Bi—Te) thermoelectric materials using a Bi—Te nanocrystal process, in order to achieve a high figure of merit. The fabrication process is shown in FIG. 4. An important element in developing high figure of merit TE materials is to fabricate void generators ("voigens") and to populate voigens into the bulk TE materials. The population distribution of voigens into bulk TE materials determines the reduction level of thermal conductivity by setting up phonon bottlenecks between voigens where phonon scattering takes place. As such, the population density will depend on the desired thermal conductivity.

Figure 5:
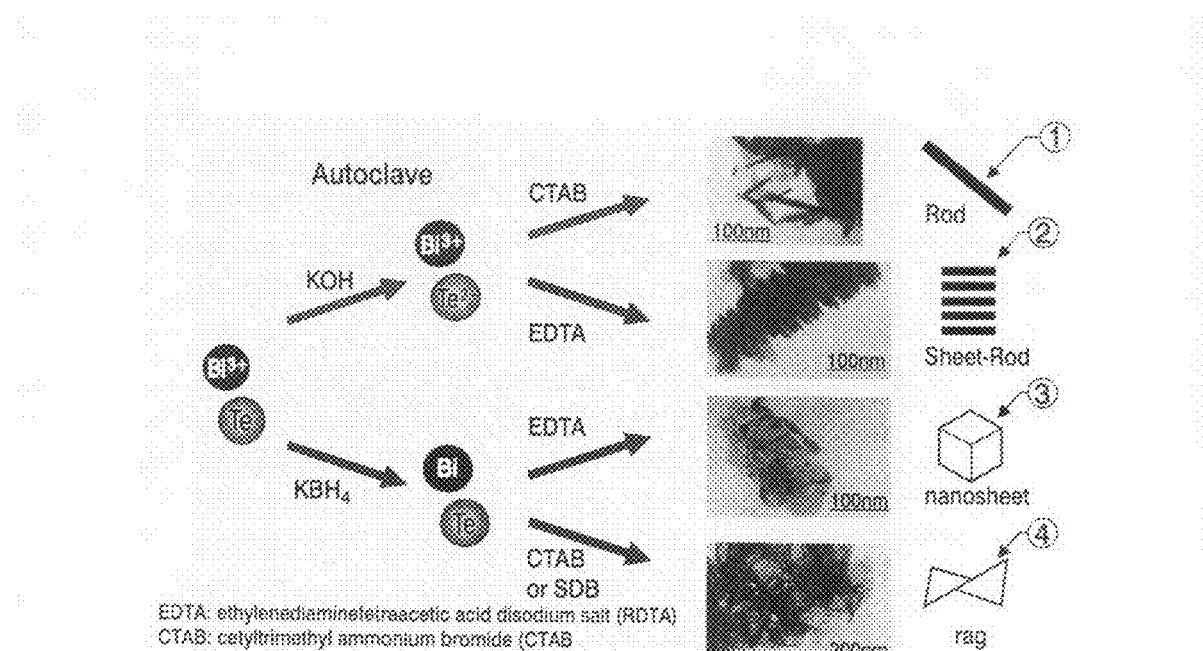
FIG. 5 is a diagram depicting a portion of the fabrication process of the Bi—Te thermoelectric material referenced in FIG. 4, i.e., the formation of low-dimensional bismuth telluride nanocrystals using solvo-thermal process.

First, precursor materials are prepared for syntheses of Bi—Te nanocrystals 40. Various Bi—Te nanocrystals can be prepared by employing the solvo-thermal process. Nanocrystals of various sizes and shapes can be made by changing synthesis conditions, as illustrated in FIG. 5. Possible geometries of nanocrystals include nanorod, nanosheet, nanosheet-rod, nanorag, etc.

Figure 6:
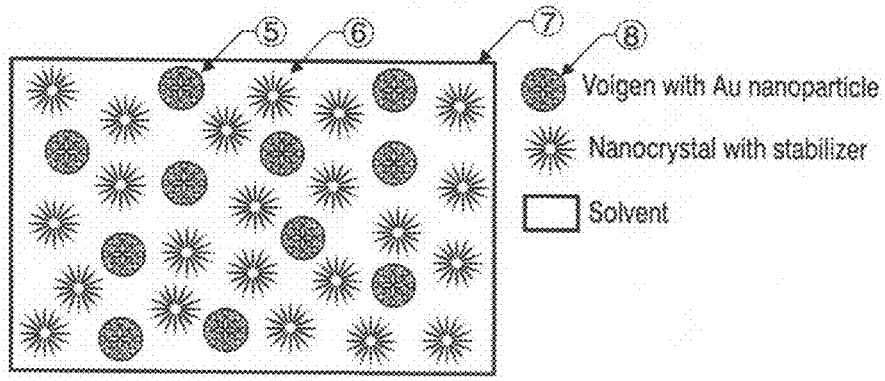
FIG. 6 is a diagram depicting a portion of the fabrication process of the Bi—Te thermoelectric material referenced in FIG. 4, i.e., a three-phase mixture of Be—Te NCs, voigens, and cosolvent.

Another important part of material preparation is to synthesize voigen materials 41. Voigen materials are designed to meet several important roles for high figure of merit TE materials: (1) phonon scattering centers, (2) reduced thermal conductivity, and (3) enhanced electrical conductivity. Creation of nanovoids with size and shape uniformity is also an important issue that will determine void fraction within bulk TE materials. To enhance electrical conductivity, voigen materials (e.g., ferritin protein), which are in a nano-scale, generally approximately 8 nm inner diameter and 12 nm outer diameter are coated with a metal lining, such as but not limited to gold, cobalt, platinum, manganese, and iron. While the voigen material is not limited to ferritin protein and may be other bio-templates, the ferritin protein is generally desirable due to its ability to form the spherical shape with void. The metal nanoparticles anchored on the voigen material surface eventually form a metal layer or lining through an annealing process. The annealing process comprises hydrogen calcination and hydrogen plasma quenching. The metal lining is approximately several atomic layer thick and generally no more than approximately 3 to 4 nanometers. Nanometer-scaled voigen molecules can be dispersed in a cosolvent system with Bi—Te nanocrystals 42, as illustrated in FIG. 6. The nanoscale phase separation between the precursor and voigen is induced by their thermodynamic miscibility, and determines the final nanovoid structure. The diameter of voigen materials is designed to be less than approximately 20 nm after coated with the metal nanoparticles. The metal nanoparticles will remain as a metal lining that forms a spherical void after a pyrolysis process. The metal lining that forms the spherical void forms the passage for electrons which provides for high electrical conductivity. In conjunction with the reduced thermal conductivity attributed to the phonon scattering of nanovoids, the enhancement of electrical conductivity is desirable for high figure of merit TE performance. Overall TE performance can be possibly deteriorated by the aggregation of metallic spherical voids without spreading within the bulk material. Accordingly, the distribution of nanovoids throughout the TE material is important.

Figure 7:
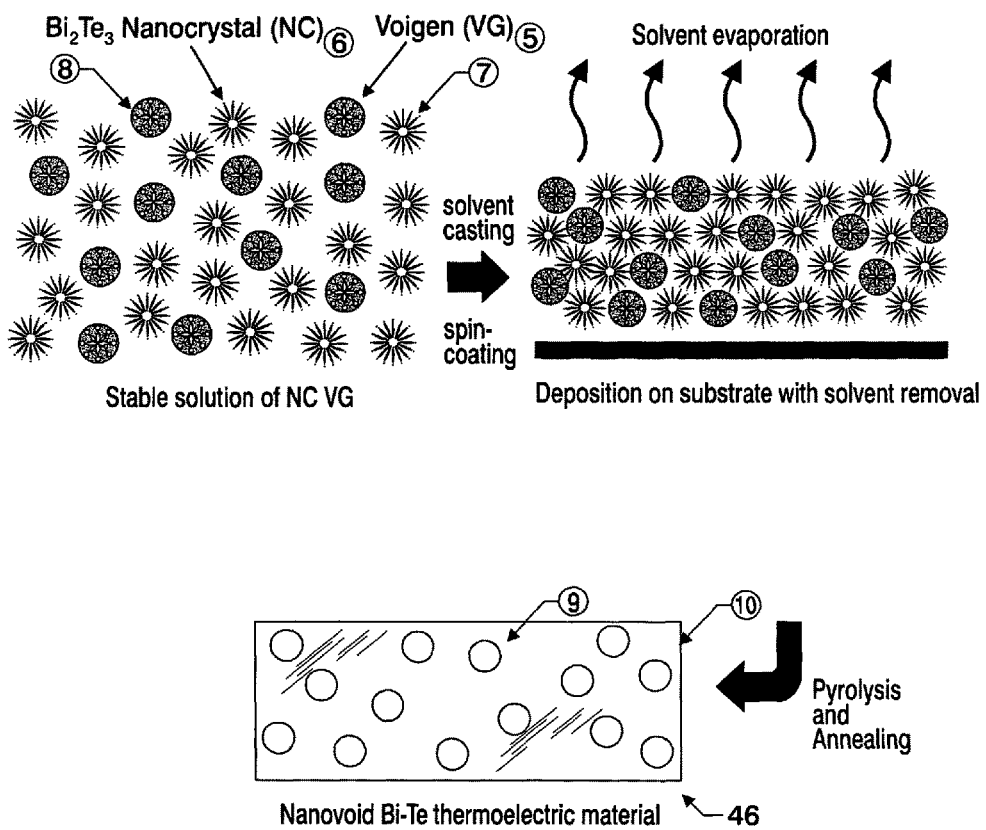
FIG. 7 is diagram depicting a portion of the fabrication process of the Bi—Te thermoelectric material referenced in FIG. 4, i.e., fabrication of nanovoid Bi—Te material by deposition and pyrolysis process that creates nanovoid structure in thermoelectric material.

The mixture of the three-phase system (bismuth, tellurium, and voigens) is deposited on a substrate using solution-based thin-film coating methods. Known substrates, such as silicon, are suitable. Suitable coating methods include spin-coating, dipping, solvent casting, etc. 43. After coating or casting, the films are placed in a vacuum chamber and heated under the environment of ultra pure hydrogen (approximately 99.999%) 44. A temperature of less than approximately 400° C. is generally desirable. The heating time is dependent on the thickness of the film, but generally approximately one hour. Voigen material which is organic, such as ferritin protein, and other organic components from the solution used are thermally decomposed and removed during pyrolysis process 44 until nanovoid-incorporated Bi—Te film 46 is obtained, as illustrated in FIG. 7. Hydrogen calcination and hydrogen plasma quenching 45 are then used, which first remove oxygen components that are the residue of organic breakdown with hydrogen plasma and second make crystalline structure in Bi—Te films through the annealing process, respectively.

Figure 8A:
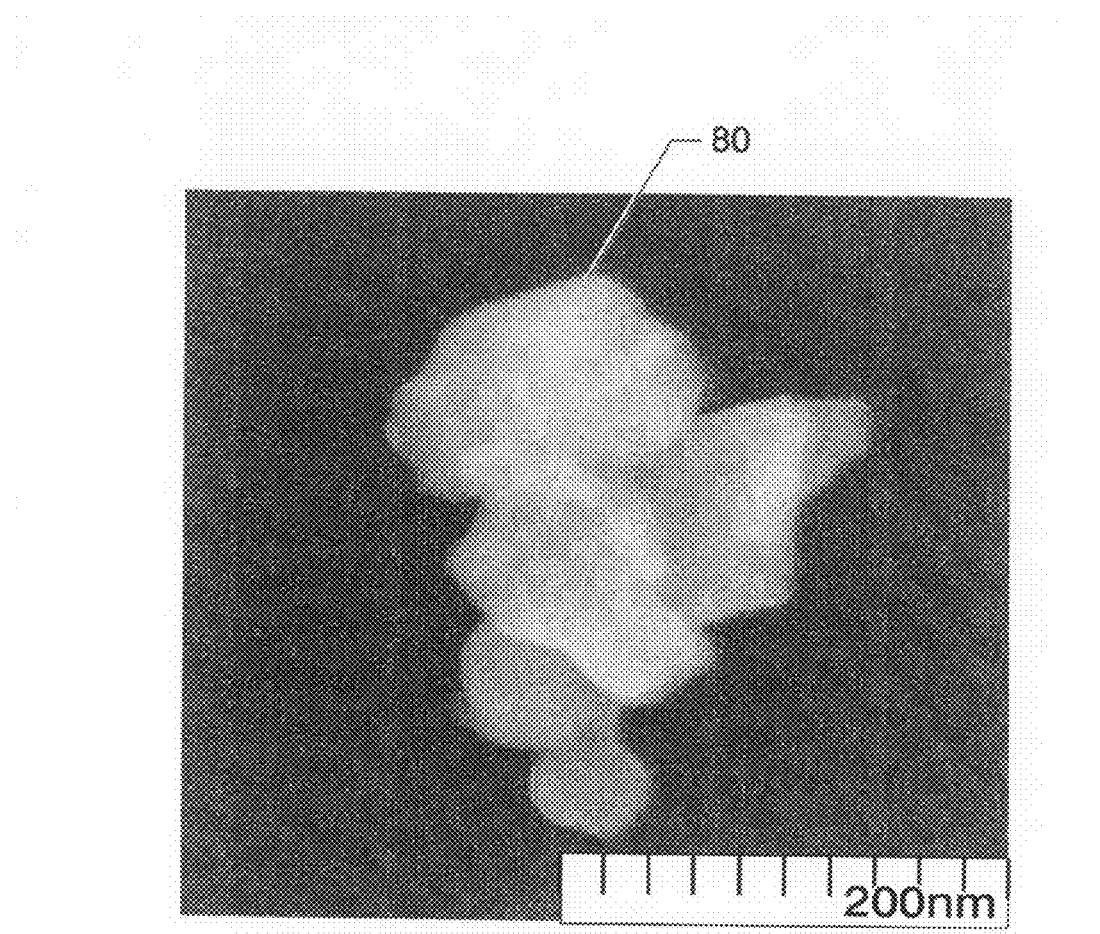
FIG. 8A is an image of two-dimension nanosheets fabricated using bismuth telluride crystals which can be utilized in at least one embodiment of the present invention.
Figure 8B:
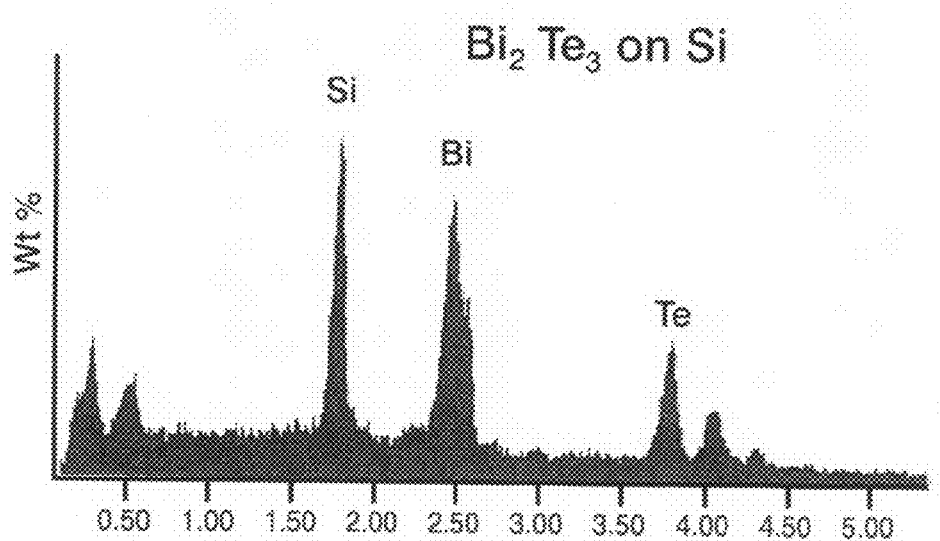
FIG. 8B is a graph of element analysis data by EDAX of same the nanosheets shown in FIG. 8A.

A solvothermal pre-process to make the $Bi_2Te_3$ nanoparticles successfully produced black powder of bismuth telluride crystal with low dimension. FIG. 8A shows two-dimensional nanosheets 80 fabricated using potassium hydroxide (KOH) and ethylenediamine tetraacetic acid (EDTA), following the synthesis process described in FIG. 5. The nanosheets varied in size, all thicker than approximately 30 nm, and Energy dispersive X-ray spectroscopy (EDAX) analysis using FE-SEM (Field Emission Scanning Electron Microscopy) confirmed the existence of $Bi_2Te_3$ by element energy analysis, as shown in FIG. 8B. The thickness of the nanosheet is dependent on the repetition of the coating process.

Figure 9:
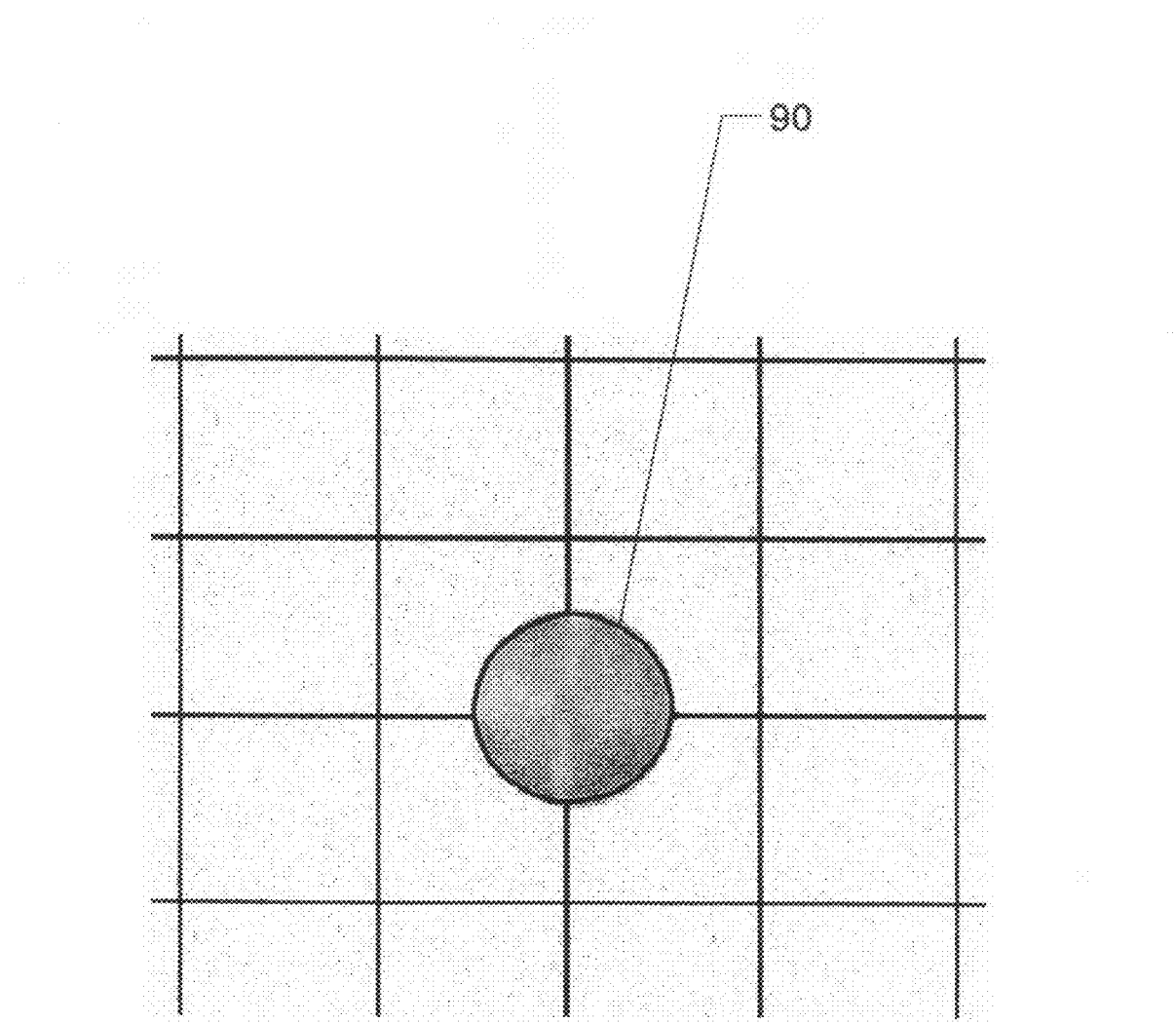
FIG. 9 is an image of a bismuth telluride disk fabricated by a cold press method, which can be utilized in at least one embodiment of the present invention.

Disk-type samples were prepared using a cold press method at room temperature. FIG. 9 shows the bismuth telluride disk 90 fabricated with its nanocrystal powder. The nanoscale, nanovoid structure causes phonon scattering without disturbing electron mobility, thus increasing the figure of merit from low-dimensional nanocrystal Bi—Te materials.

The same or similar skills and/or techniques used to fabricate the nanovoid-imbedded $Bi_2Te_3$ ATE material described above can be readily extended to the fabrication of other nanovoid-embedded TE materials, such as cobalt antimonide ($CoSb_3$) and lead telluride (PbTe), at temperature ranges different from $Bi_2Te_3$ and SiGe. FIG. 3 shows several TE materials along with their associated best-suitable temperature ranges.

The present inventive energy conversion system is not limited to the above-noted layer materials. Other TE materials, and nanovoid embedded TE materials would also be suitable, and would be chosen based on the specific applications and temperature ranges. In general, suitable materials will have a high Seebeck coefficient, a high electrical conductivity and a low thermal conductivity.

Figure 10:
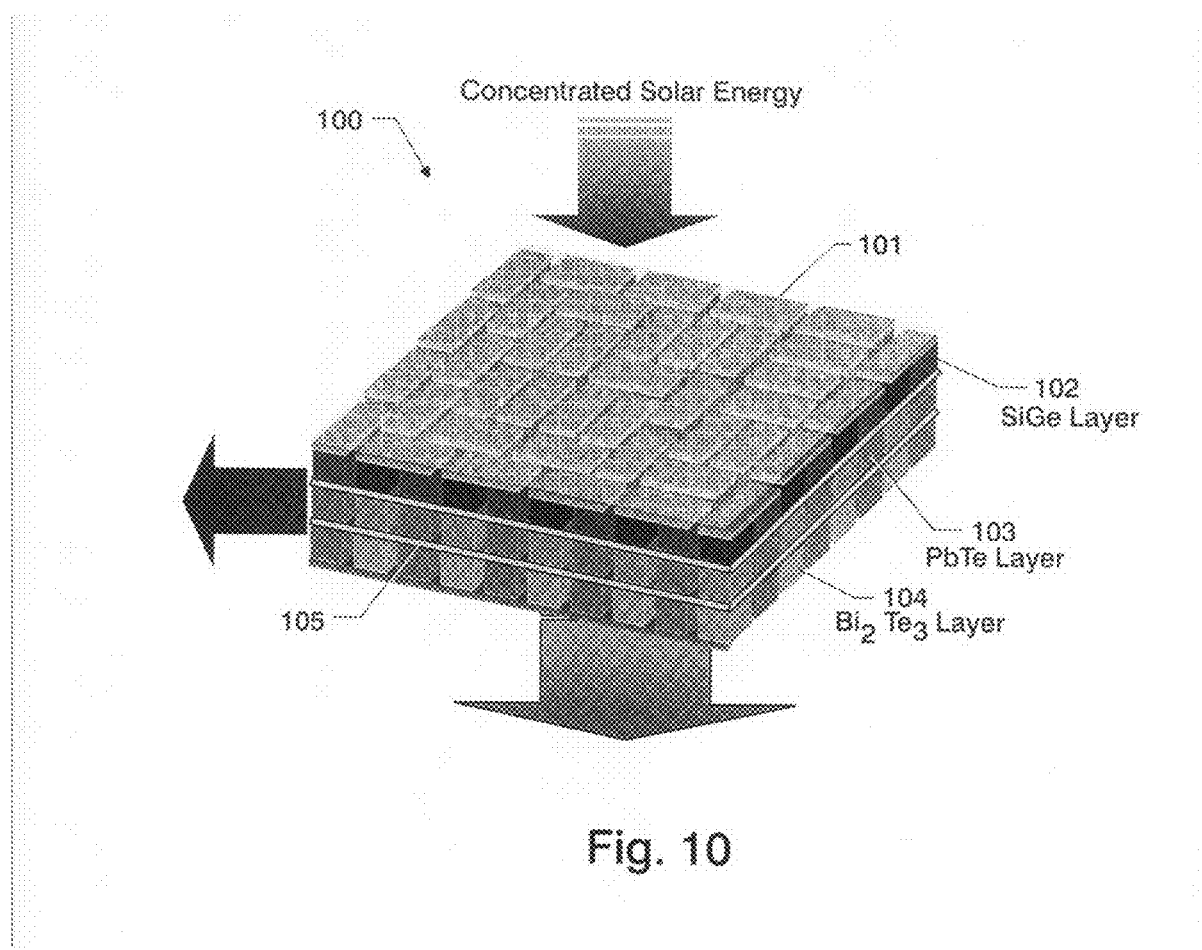
FIG. 10 is a perspective view of one possible embodiment of the ATE energy conversion system of the present invention.

In accordance with the present invention, these ATE materials can be utilized in the manufacturing of ATE energy conversion devices and systems, as illustrated in FIG. 10. To make a p-n junction for TE energy conversion, the TE matrix materials developed can undergo conventional doping processes to create N-type and P-type materials (i.e., semiconductors).

As understood in the art, "doping" refers to the process of intentionally introducing impurities into an intrinsic semiconductor in order to change its electrical properties. A P-type semiconductor is obtained by carrying out a process of doping wherein a certain type of atoms are added to the semiconductor in order to increase the number of free positive charge carriers. When the doping agent (acceptor material) is added, it accepts weakly-bound outer electrons from the semiconductor's atoms, and creates holes (i.e., atoms that have lost an electron). The purpose of P-type doping is to create an abundance of such holes. When these holes move away from its associated negative-charged dopant ion, one proton in the atom at the hole's original location is now "exposed" and no longer cancelled by an electron, resulting in a hole behaving as a quantity of positive charge. When a sufficiently large number of acceptor atoms are added, the holes greatly outnumber the thermally-excited electrons. Thus, the holes are the majority carriers in P-type materials, and the electrons are the minority carriers. In contrast, an N-type material is obtained by adding a doping agent known as a donor material, which donates weakly bound outer electrons to the semiconductor atoms. For example, an impurity of a valence-five element can be added to a valence-four semiconductor in order to increase the number of free mobile or carrier electrons in the material. These unbound electrons are only weakly bound to the atoms and can be easily excited into the conduction band, without the formation of a "hole," thus the number of electrons is an N-type material far exceeds the number of holes, and therefore the negatively charged electrons are the majority carriers and the holes are the minority carriers.

Figure 11:
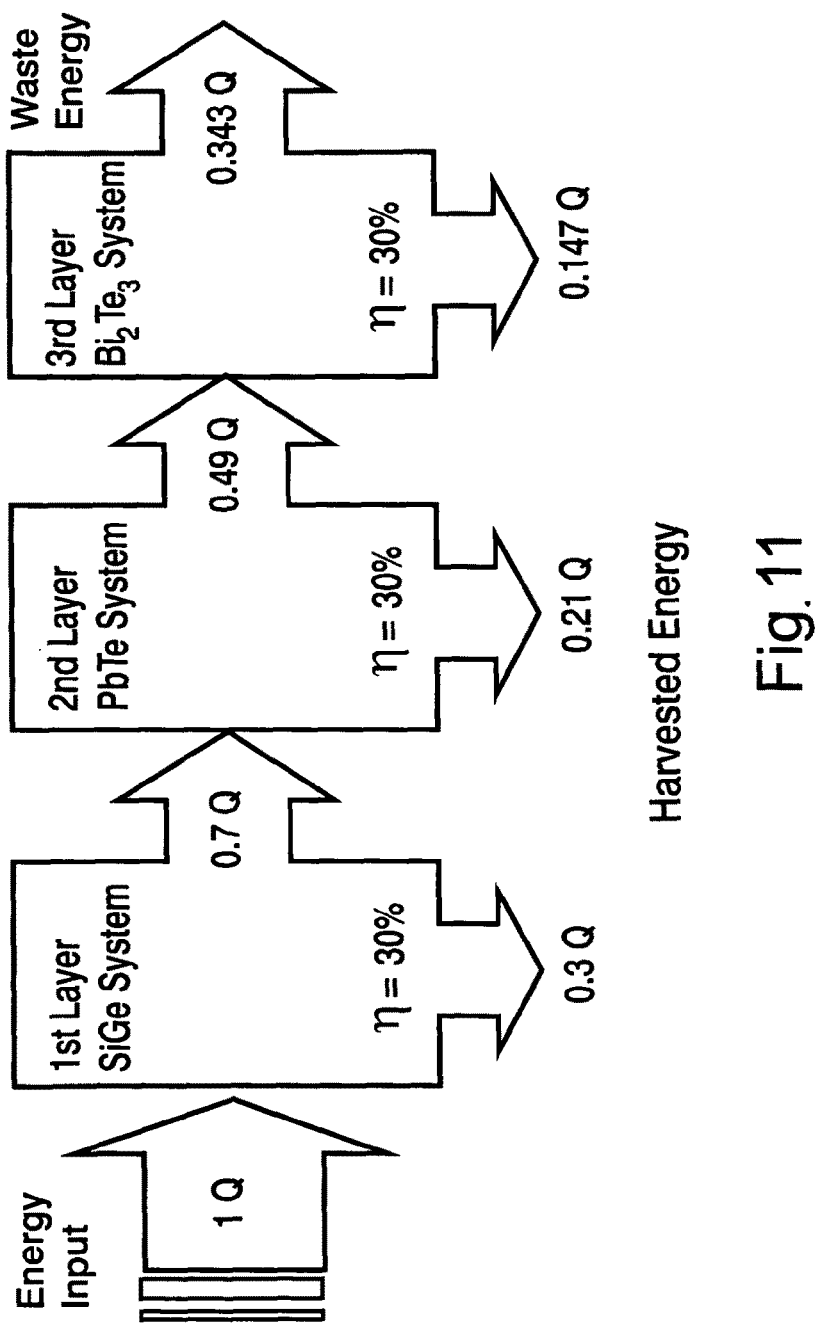
FIG. 11 is a flow chart depicting the cascaded efficiency of a 3-layer ATE system in a tandem mode in accordance with at least one embodiment of the present invention.

Non-limiting examples of doping material that could be used in the instant invention are boron and phosphor, which doping could be done in a known manner, such as by ion implantation or diffusion. In general, an array of pairs of p-n junction materials, or elements, are utilized to increase the thermal exposure area. As shown in FIG. 10, a TE module 100 can consist of three layers of p-n-junction arrays 102, 103, 104 in a tandem mode that operate most efficiently at high, medium, and low temperatures, correspondingly in a tandem mode, providing a cascaded conversion efficiency. In at least one advantageous embodiment, these TE layers 102, 103, 104 comprise advanced TE materials, making a cascaded efficiency greater than about 60 percent obtainable, as indicated in FIG. 11. While the shown embodiment consists of three layers, it should be understood that depending upon the desired application, the number of layers can be varied accordingly. Additionally, these layers can be assembled in the manner known in the art, for example, a metallized ceramic 105 could potentially be layered between them.

Such a tandem arrangement allows efficient energy harvesting from a heat source, thus allowing the present inventive energy conversion system to be effectively utilized in HAA applications where solar energy is considered as an energy source. In order to address the power-related requirements for lighter-than-air vehicles, including airships and hybrid fixed-wing configurations, the integration of the ATE devices can take on many different forms, dependent on configuration needs and mission requirements. As explained above, in general, an array of a pair of p-n junction materials is necessary to increase the thermal exposure area, and the ATE energy conversion device 100 may consist of multiple layers of p-n-junction arrays, as shown in FIG. 10. The first, or top, layer 102 is built from the array of thermoelectric material segments 101 that operate optimally at the higher temperatures, such as SiGe. The subsequent layers, or stages, are driven by the rejected thermal energy of the preceding layer. The selection of the appropriate thermoelectric material for each of these subsequent layers is chosen dependent on the optimal thermoelectric figure of merit, ZT, for the respective operating temperature ranges. Referring again to the general example as shown in FIG. 10, the second and third layers 103, 104 of this 3-layer thermoelectric power system 100 are respectively built from PbTe and $Bi_2Te_3$ in a regenerative cycle mode of operation. Further, in at least one embodiment of the invention, it is desirable to utilize ATE materials such as nanovoid embedded $Bi_2Te_3$ and PbTe, and lattice-matched SeGi as the three layers. The invention, however, is not limited to these materials and may use only one or more layers of ATE materials.

In operation, the incident solar flux first heats up the initial layer 102 which is built with an optimized high temperature thermoelectric material. The unused thermal energy from the first layer is subsequently utilized by the second layer 103 which is built with an optimized mid-temperature thermoelectric material, such as PbTe. Repeating this process again, the third layer 104, such as $Bi_2Te_3$, uses the unused energy from the second layer to maximize the conversion of the energy that is otherwise rejected. With this repeated process, the number of different thermoelectric material layers needed, also depends on the overall temperature range available and desired. With the available thermal energy from the solar flux, the ATE can harness more energy than photovoltaic cells that use quantized electrons of the photons from the solar flux. The integration of advanced TE materials can provide significant levels of electrical energy because of this cascaded efficiency of multiple-layer TE modules 100 that are much higher than the efficiency of a single layer and the broad use of the solar thermal energy. The layered structure of the advanced TE materials is specifically engineered to provide maximum efficiency for the corresponding range of operational temperatures. A representative three layer system of advanced TE materials, as shown in FIG. 10, generally operates at high, medium, and low temperatures, correspondingly in a tandem mode. The cascaded efficiency of such an arrangement is estimated to be greater than 60% as indicated in FIG. 11. With multiple advanced thermoelectric material stages, a highly effective and efficient energy harvesting system may then be optimized for representative operational requirements such as maximum power, minimum weight, minimum size, etc.

As mentioned above, these ATE materials can be chosen to fit specific applications depending upon the overall temperature range available and desired. This same procedure can be used to construct specialized TE energy conversion devices in accordance with the present invention, for many different applications, including a variety of different heat sources. That is to say, by understanding each application prior to fabricating the inventive TE energy conversion device, the appropriate ATE materials can be chosen and layered (e.g. depending upon the original thermal load and a calculation of how much heat must be removed from this load by each layer, to achieve the desired performance objectives for each layer and overall).

Additionally, as would be known to one with ordinary skill in the art, the thickness of each layer can also be varied (for example, by increasing the number of sub-layers of the ATE material) until a desired temperature reduction is achieved prior to the thermal energy passing into the next layer, so that, optimally, when the energy is passed to the next layer it is at a temperature that will permit peak, or close to peak, thermal energy conversion performance by the receiving layer. Typically, a layer thickness might range from less than 1 mm to several millimeters, or more, in thickness, depending upon the material and application.

Figure 12:
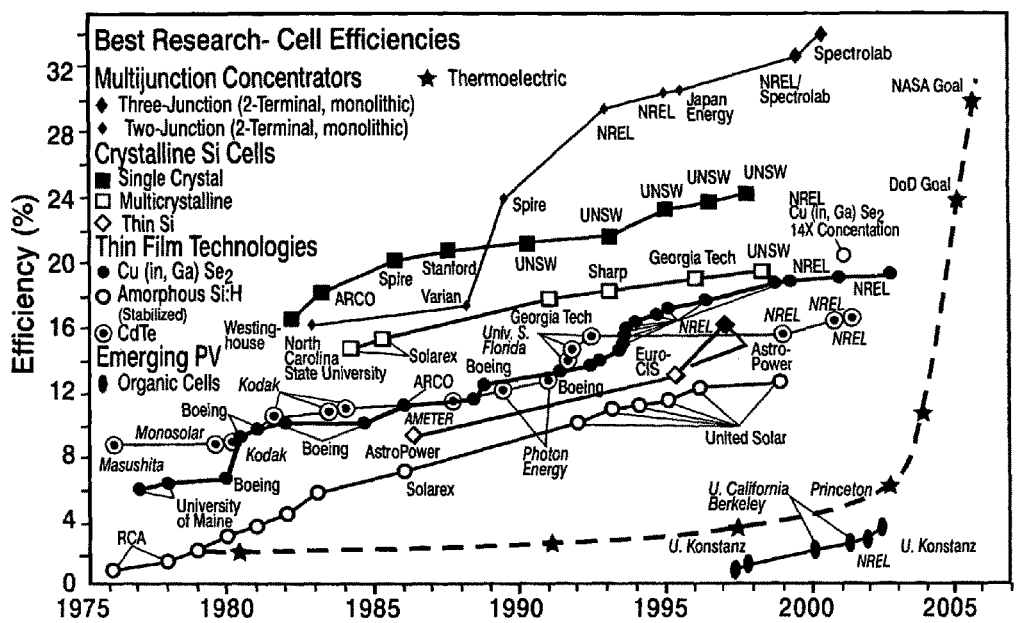
FIG. 12 is a graph depicting the efficiencies of state-of-the art solar, and thermoelectric cells.

In this inventive fashion the overall efficiency of the system increases beyond that achieved by known methods (for example, where only one known TE material is used). Additionally, the ATE devices of the present invention become more effective than solar cells because the performance of solar cells is monolithically tied to band-gap energy structure, so that they only couple with certain spectral lines. Also, the higher the efficiency of the solar cells, the higher the cost and complexity of fabrication. For comparison purposes, FIG. 12 shows the layout of predicted figure of merits as a goal to achieve, which is added onto an existing diagram of solar cell efficiencies. As compared to solar cell technology in efficiency, the ATE system is competitive. However, considering the available energy from solar flux, the ATE system, using thermal energy, can harness more energy than photovoltaic cells that use the quantized electrons by photons from solar flux.

While solar energy conversion is discussed in detail herein, and specifically in reference to HAAs, it should be reiterated that the instant power conversion invention is not so limited in scope, rather the instant ATE energy conversion system can be used to harvest heat from a wide variety of sources (e.g., power plants, radioisotopes, automotive cooling systems, etc.) for many different energy generation and/or cooling applications. Additionally, the completion of the fabrication of the final circuitry and fabrication of an operable thermoelectric conversion system using the inventive system disclosed herein, would be understood by someone with ordinary skill in the art as these techniques are well-known in the art.

There are several potential candidate energy harvesting technologies for HAAs, such as solar cells, fuel cells, Sterling engines, and TE generators. Due to the abovementioned restrictions, ATE devices are extremely attractive because of the cascaded efficiency of the multi-layer TE modules of the present invention, that are much higher efficiency than the efficiency of a single layer and the broad use of solar thermal energy. As explained above, the layered structure of the ATE materials is specifically engineered to provide maximum efficiency for the corresponding range of operational temperatures. The present invention essentially functions like regenerative cycles in tandem. Such a highly effective energy harvesting feature of this tandem system based on multiple layers of advanced TE materials can be the basis of an HAA power budget plan.

Figure 13A:
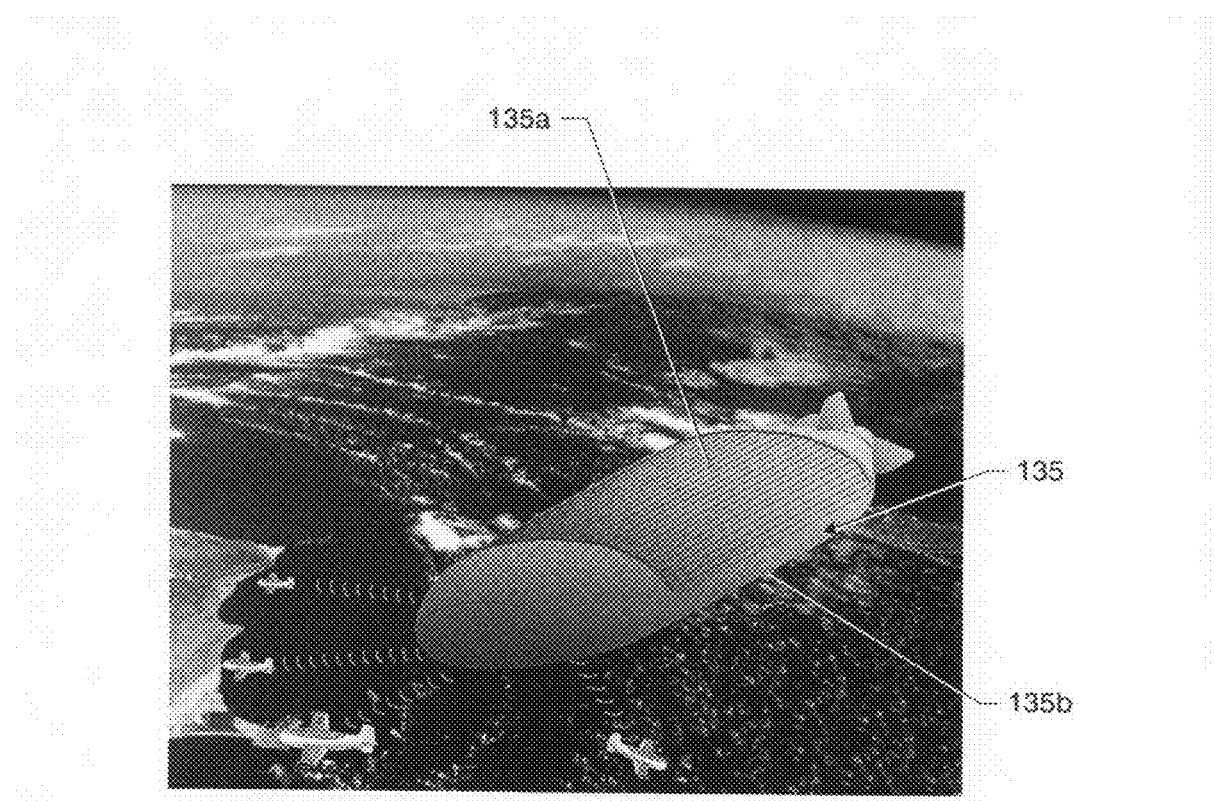
FIG. 13A is a perspective view of a flattened airship with ellipsoidal cross-section to maximize the reception of solar flux in accordance with at least one embodiment of the present invention.
Figure 16:
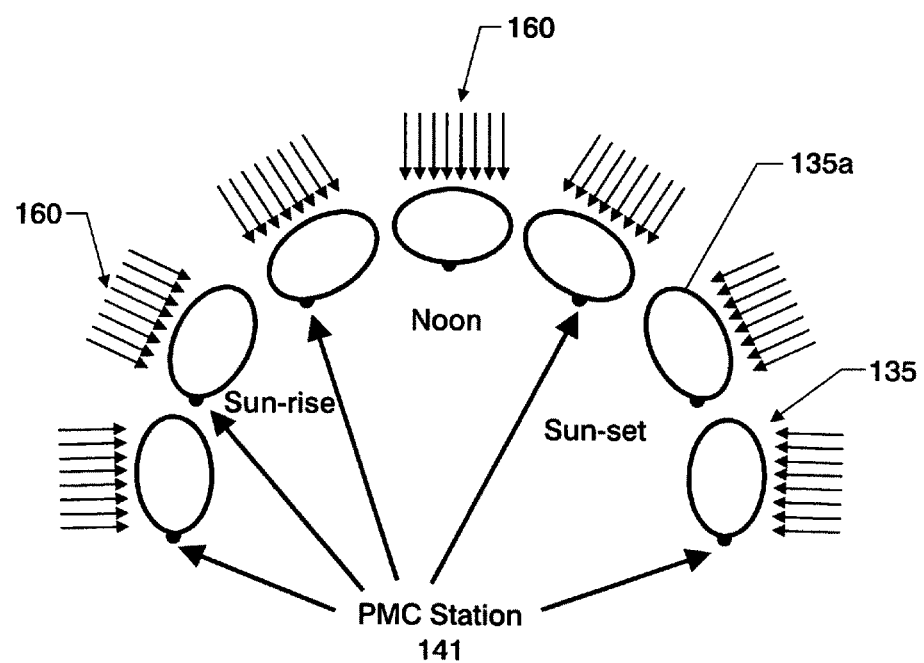
FIG. 16 are front views of an HAA, depicting a method of operation of the HAA, in accordance with at least one embodiment of the present invention.

In accordance with the present invention, to maximize the reception of solar thermal energy, an ellipsoid cross-sectioned high altitude airship (HAA) 135 has been designed, as shown in FIG. 13A. In at least one embodiment, such an HAA can be 150 meters long, 60 meters wide, and 24 meters high. In size, this HAA is about 2.5 times larger than a Goodyear® blimp, which is 60 meters long. With this dimension of HAA 135, the perpendicularly incident solar power amounts to about 9 MW. However, the daytime exposure varies with sun location. As shown in FIG. 16 (a cross-sectional view), if it is necessary, the HAA 135 can be reoriented to receive the maximum solar energy by keeping the top surface 135a of the HAA 135 always substantially perpendicular to the solar angle 160. In at least one embodiment, a vectored electric propulsion system can be used for this purpose.

When the top surface 135a of HAA 135 follows the sun, the power management and control (PMC) station 141 installed under the belly of HAA 135 is designed to move on a guide rail 140 (shown in FIG. 14), to reposition itself, always dangling at, or near, the bottom, or lowest point, of HAA 135 for every collector orientation. FIG. 16 shows the repositioned PMC 141 at the nadir point of HAA 135 along with the sun position 160. In such a manner, the energy harvested from sun-rise to sun-set becomes effectively maximized, regardless of exposure variation over the course of the day. Using 20% efficient photovoltaic (PV) cells, the maximum converted power would be less than 2 MW. With the inventive advanced TE system of the same efficiency, the converted power would be greater than 4 MW because the cascaded efficiency of three layers is calculated to be approximately 49%. Considering a three-layered structure of the advanced TE materials having a FOM 5, the cascaded efficiency amounts to be close to 66% (see FIG. 11). If the amount of losses (35%) due to geometrical orientation (23%), reflection (7%), absorption (3%), and transmittance (2%) is considered for the estimation of cascaded efficiency, the total harvestable unit becomes 0.427 under the condition of 0.65 Q input instead of 1 Q used in FIG. 11. Accordingly, the obtainable power amounts to be 3.84 MW which is substantial to accommodate several roles of the HAA. FIG. 13A depicts some of the scenarios that might be feasible, such as feeding power to off-shore or isolated locations, for example, in lieu of having to build expensive power stations. The HAA can also become a mothership to wirelessly feed power to deployed unmanned vehicles.

Figure 13B:
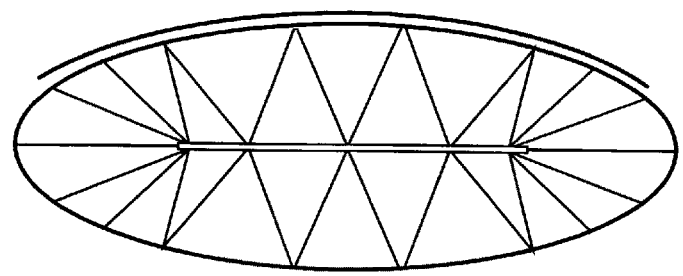
FIG. 13B depicts the ellipsoidal cross section of the airship shown in FIG. 13A.
Figure 13C:
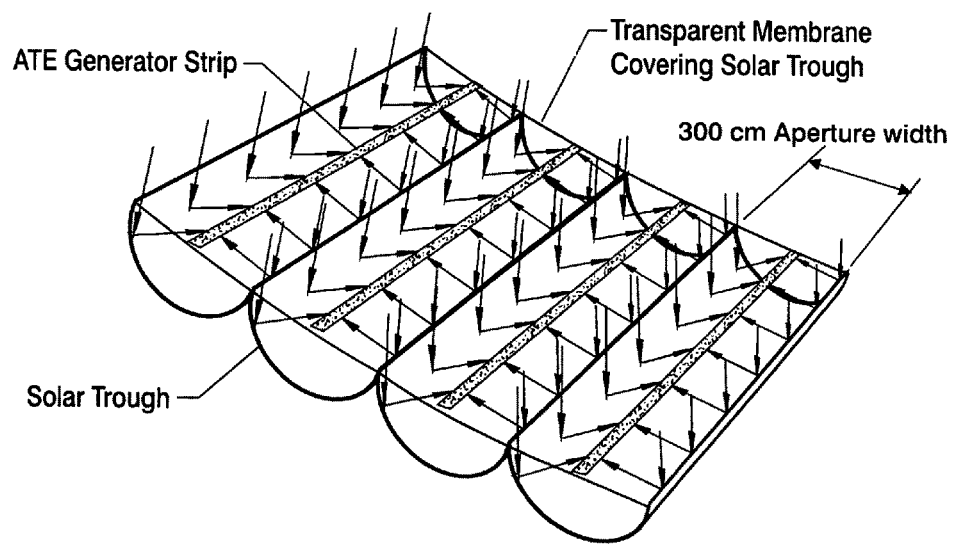
FIG. 13C is an expanded view of the solar troughs disposed on the top surface of the airship shown in FIG. 13A, utilizing the ATE conversion system.
Figure 15:
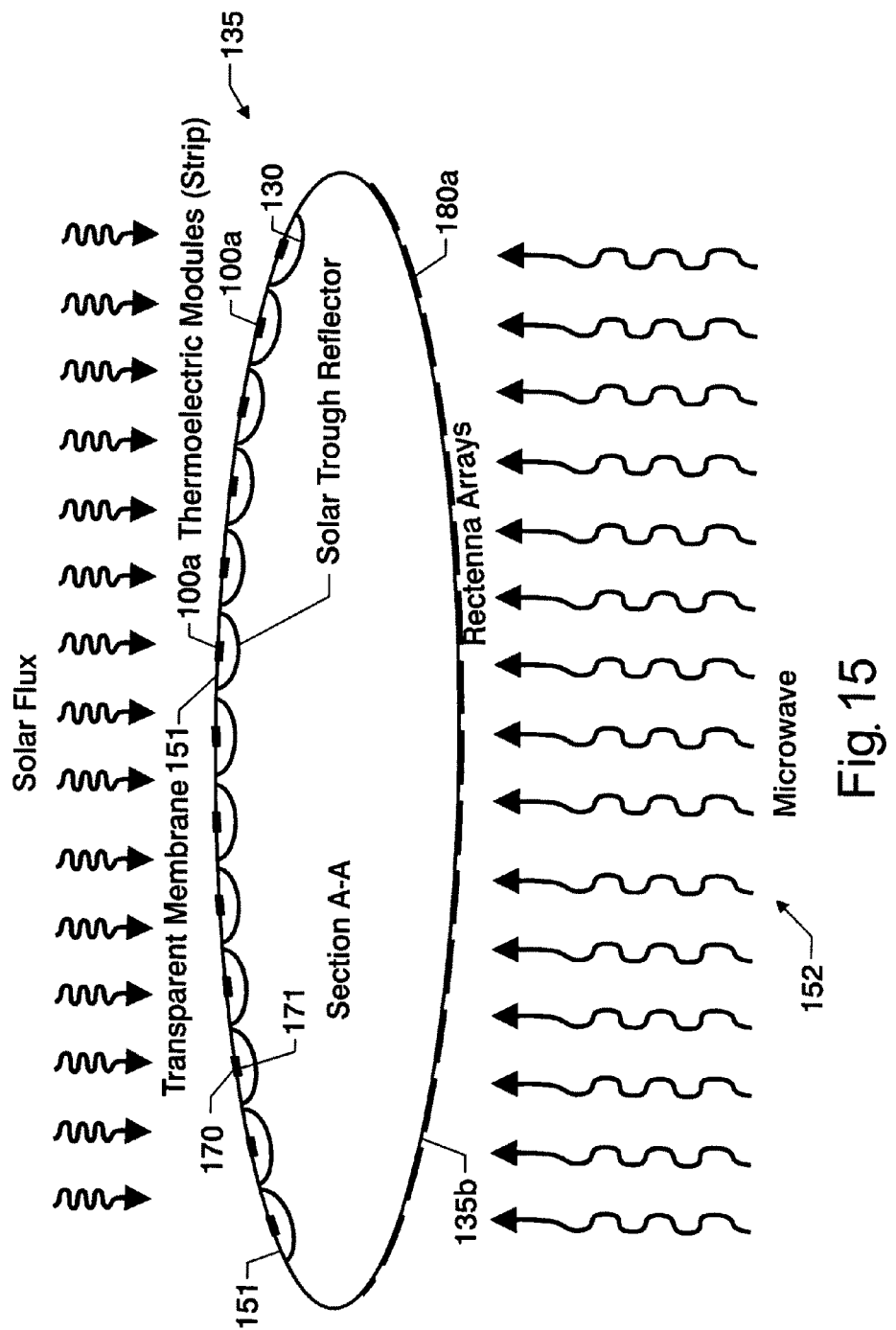
FIG. 15 is the cross-sectional view of the HAA along the plane indicated by dashed line A-A in FIG. 14.
Figure 17:
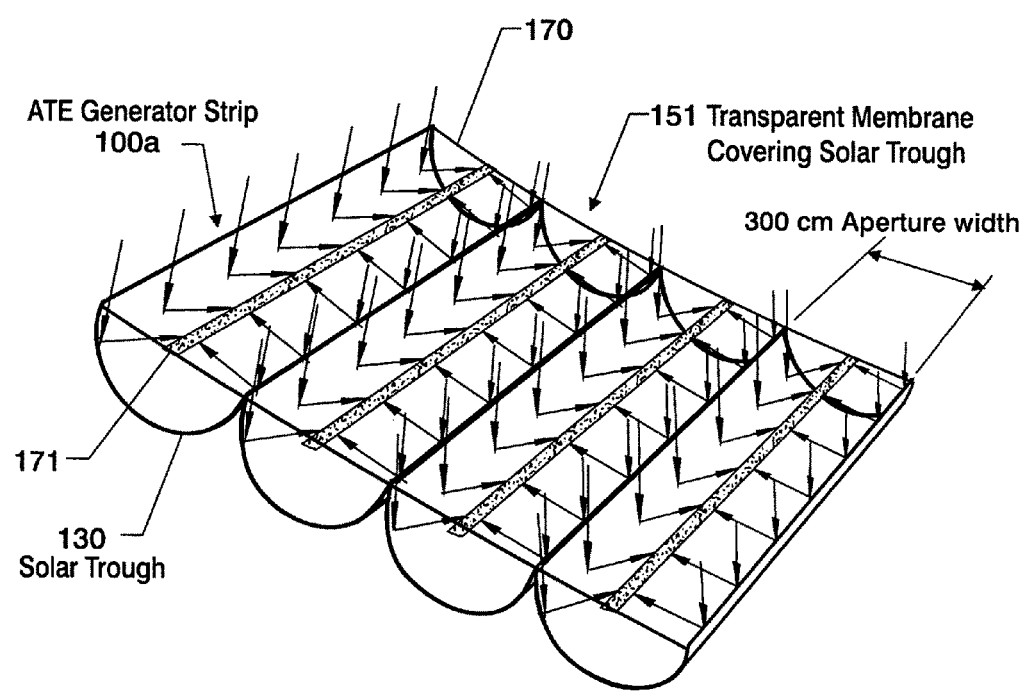
FIG. 17 is a drawing of the troughs shown in FIG. 13C, depicting ATE power modules utilized with linear parabolic troughs to collect solar flux, in accordance with at least one embodiment of the present invention.

Referring to FIGS. 13, 15 and 17, in one embodiment of the present invention, the ATE power module 100 (FIG. 10) can be used in conjunction with linear parabolic troughs 130. These troughs 130 can have a 300 cm aperture width to collect solar power, as shown in FIG. 17. In at least one application, the back-surface 170 of ATE strips 100a is reflective to reduce solar energy absorption and faces outside directly to the cold environment of high altitude to drop the surface temperature by convective cooling. The temperature at 70,000 feet or above in the atmosphere is extremely cold and hovers below −73° C. Accordingly, to maximize the performance of the ATE system, the solar trough concentrators are used to focus solar flux to the surface 171 of the $1^{st}$ layer that faces the reflector trough 130 while the back side 170 of the $3^{rd}$ layer faces the cold atmosphere to increase the temperature gradient. In at least one embodiment, the material of the reflector trough 130 can be, for example, enhanced aluminum coated thin-film membrane which is sufficiently hardened to maintain its parabolic shape. Each reflector 130 can be covered by a transparent membrane 151 that allows sun light to impinge into the parabolic trough 130. The strip of ATE power module 100*a* is located on a focal line of the parabolic trough 130 and connected to the transparent thin film window material 151, for example, both edges of the strip 100*a* can be connected to the transparent material 151. An additional advantage of this type of ATE energy conversion system is that the structural formation of such solar trough 130 will enhance the strength of large sized HAA.

The nighttime power requirements of HAAs may not be alleviated because the HAA's nighttime operation frequently has the same importance as their daytime operation. Therefore, the power for nighttime operation typically must be the same level as that of the daytime usage. Based on the daytime figure for required power, three components of power infrastructure are actively involved to supply necessary power. That is to say, for nighttime, the power required can be augmented from the onboard fuel cells, battery and a rectenna array 180*a* that is attached at the bottom surface 135*b* of HAA 135 (see FIGS. 14 and 15, where the rectenna array is indicated by a dashed line). These combined systems provide at least a megawatt level of power for the intermittent operation.

Hydrogen fuel-cells with the capacity of several hundreds kilo-watt level are onboard for the nighttime power generation. The water which is an end product of fuel-cell process is collected and dissociated into hydrogen and oxygen through electrolysis process using the power harvested during daytime. The hydrogen and oxygen is collected and fed back to fuel cells later at nighttime.

The power stored in the thin-film battery during daytime can be drained out for nighttime use. The battery storage capacity (~600 Coulomb/gram) is proportional to its own weight increase. Therefore, the battery is not regarded as the major power provider for night time use. It can be used for emergency purposes.

Figure 18A:
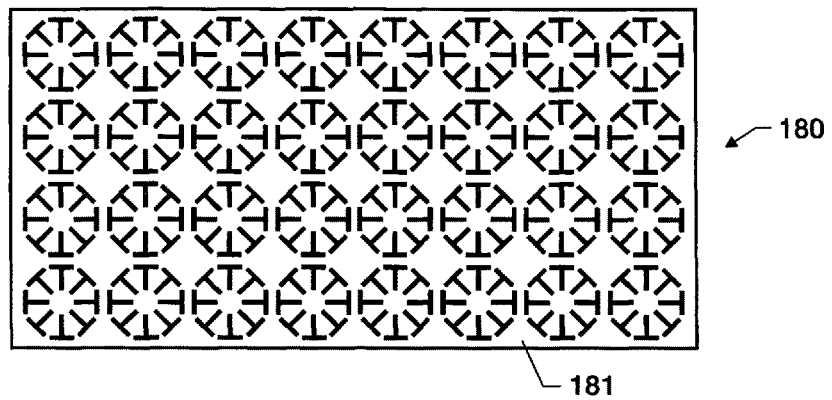
FIG. 18A is a drawing of a flexible thin-film rectenna array that, in at least one embodiment of the present invention, can be attached under the bottom surface of an HAA to receive and convert microwave power into DC Power.
Figure 18B:
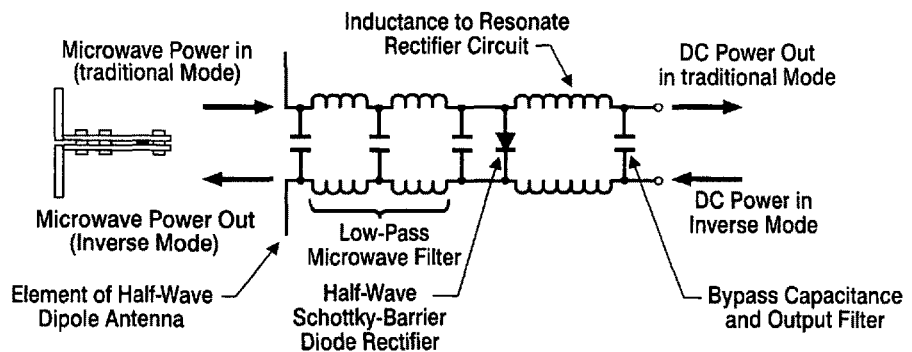
FIG. 18B illustrates an example of a circuit that could be utilized in the rectennas depicted in FIG. 18A.

The arrays of thin-film rectennas 180, as shown in FIG. 18A, can be readily fabricated on a flexible film 181 which can be used within the structural envelope of the HAA. In at least one embodiment, the arrays 180/180*a* are patched under the bottom surface 135*b* of HAA 135 (see FIG. 15, which depicts a cross-sectional view of the HAA shown in FIG. 14), to receive and convert microwave power 152 into DC Power, as illustrated schematically in FIG. 18B. The conversion efficiency of rectennas is unusually high (~85%), but the collection efficiency is poor because of the dispersive nature of microwave. The bottom surface area of HAA 135 is wide and nearly flat to enable the HAA 135 to collect most of dispersed microwave energy. At the 21 km (~70,000 ft) altitude, the area required to collect the w-band (90~100 GHz) microwave is approximately 48 meters in diameter. This number is calculated by the Gaubau relationship, which is defined by the following formula:

$$\tau = \frac{\sqrt{A_r \cdot A_t}}{\lambda Z}$$

wherein: $A_r$ is the area of receiving antenna; $A_t$ is the area of transmitting antenna; Z is the distance between the transmitting and receiving antennas; $\lambda$ is the wavelength of microwave; and $\tau$ is the parameter determined for 100% reception which, in the case for microwaves, is 3.

Figure 19:
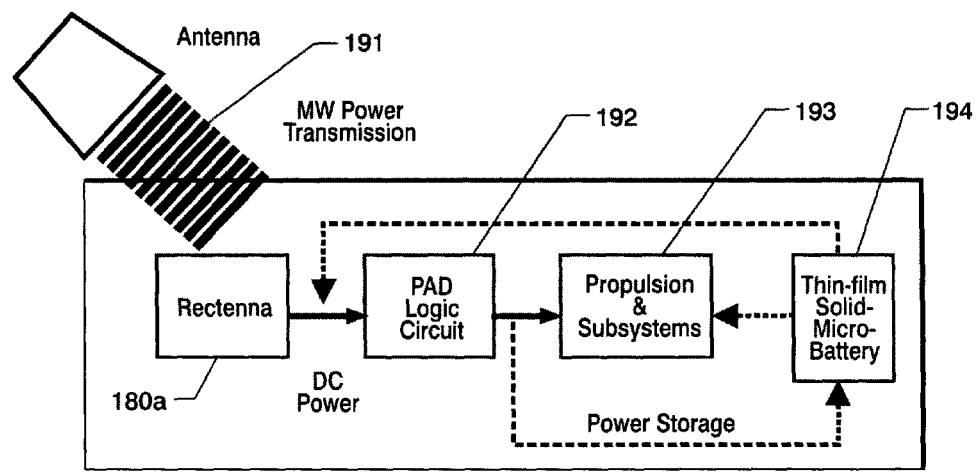
FIG. 19 is a logic diagram of potential microwave power use by an HAA equipped with a rectenna array, such as the array depicted in FIG. 18.

In at least one embodiment of the present invention, the bottom surface 135*b* of HAA 135 can be 150 meters long and 60 meters wide. Accordingly, the microwave power at the w-band can be delivered to the array of rectennas 180*a* at the bottom surface 135*b* of HAA 135 almost all without loss. FIG. 19 shows a logic diagram of microwave power use. The power 191 received by rectenna arrays 180*a* is allocated and distributed by the power allocation and distribution (PAD) logic circuit 192 to specific nodal points where the power is mostly needed, such as propulsion unit or subsystems 193. Otherwise, the excessive power can be stored in an array of thin-film solid-state batteries 194 for later use. Thus, a large amount of microwave power can be delivered to the HAA 135 from a ground or a ship-board microwave power beaming station. Even for a remotely dispatched HAA 135, wireless airborne electro-refueling by airplanes is possible. Multiple microwave stations combined can aim their beams onto a rectenna-equipped HAA 135 to feed the power required for the operation at night.

Figure 20:
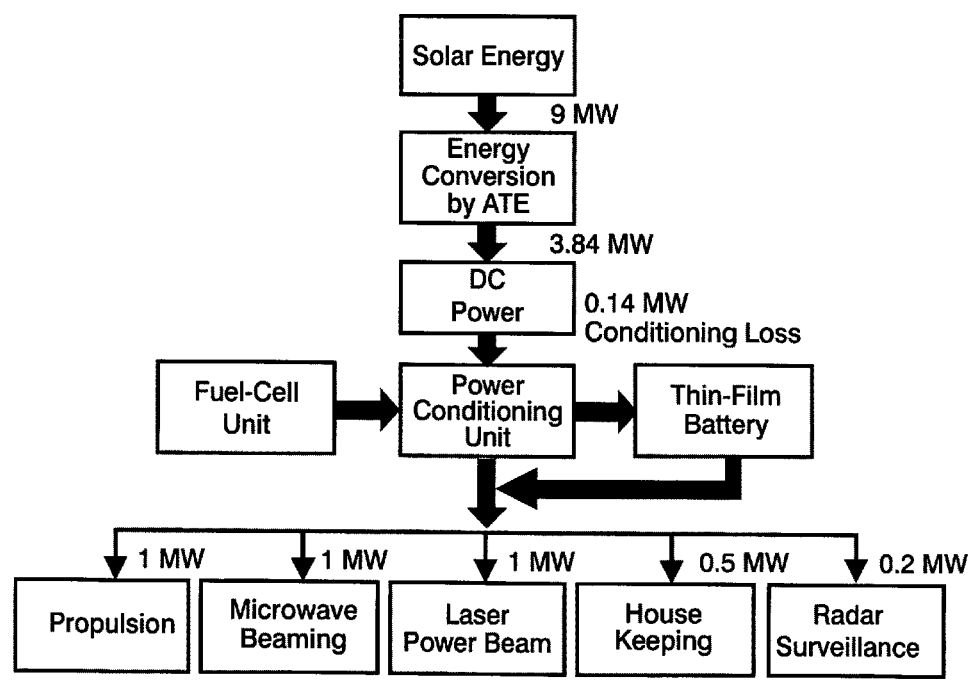
FIG. 20 is flow chart depicting a possible power distribution scenario of an HAA for various application devices that might be onboard.

The power harvested by the inventive ATE generator can be utilized for the power transmission to UAVs, for onboard systems operation, and for internal power requirements such as propulsion and control. FIG. 13A illustrates a graphical scenario of operational mode of an HAA 135. If more power is required, of course, in at least one embodiment, it is solved by the enlargement of HAA 135, and the utilized ATE system 100*a* with troughs 130. The total power harvested (3.84 MW) can be distributed for propulsion for stationary positioning and maneuvering, power storage, microwave beaming for MAV or UAV operations, laser power beaming to ground locations, such as for illumination or telecommunication purposes, and house-keeping activities. Such applications require a continuous power source that will run for several hours in a sequential or a pulse mode anytime throughout the day and the night. FIG. 20 shows the power flow diagram based on the power estimation that is to be harvested by the ATE array placed on top of the HAA. The power allocated for the operations of those onboard devices is estimated to give a glimpse at one possible power picture.

The power harvested by the inventive ATE generator can also be utilized for propulsion for position correction and maneuver. The wind at an altitude of 21 km (70,000 feet) or above is substantially lower than typical seasonal jet-streams that exist within the northern hemisphere. Nevertheless, the large cross-section of the HAA is vulnerable to drifting along with wind. Continuous positioning and maneuvering operation of the HAA against the wind is necessary and crucial for the stationary operation and maximum solar exposure over solar angle variation. Otherwise, the HAA will drift away to an undesirable location where the use of onboard devices may be impossible. The propulsion for position correction and maneuvering is also required during the night time.

Figure 21:
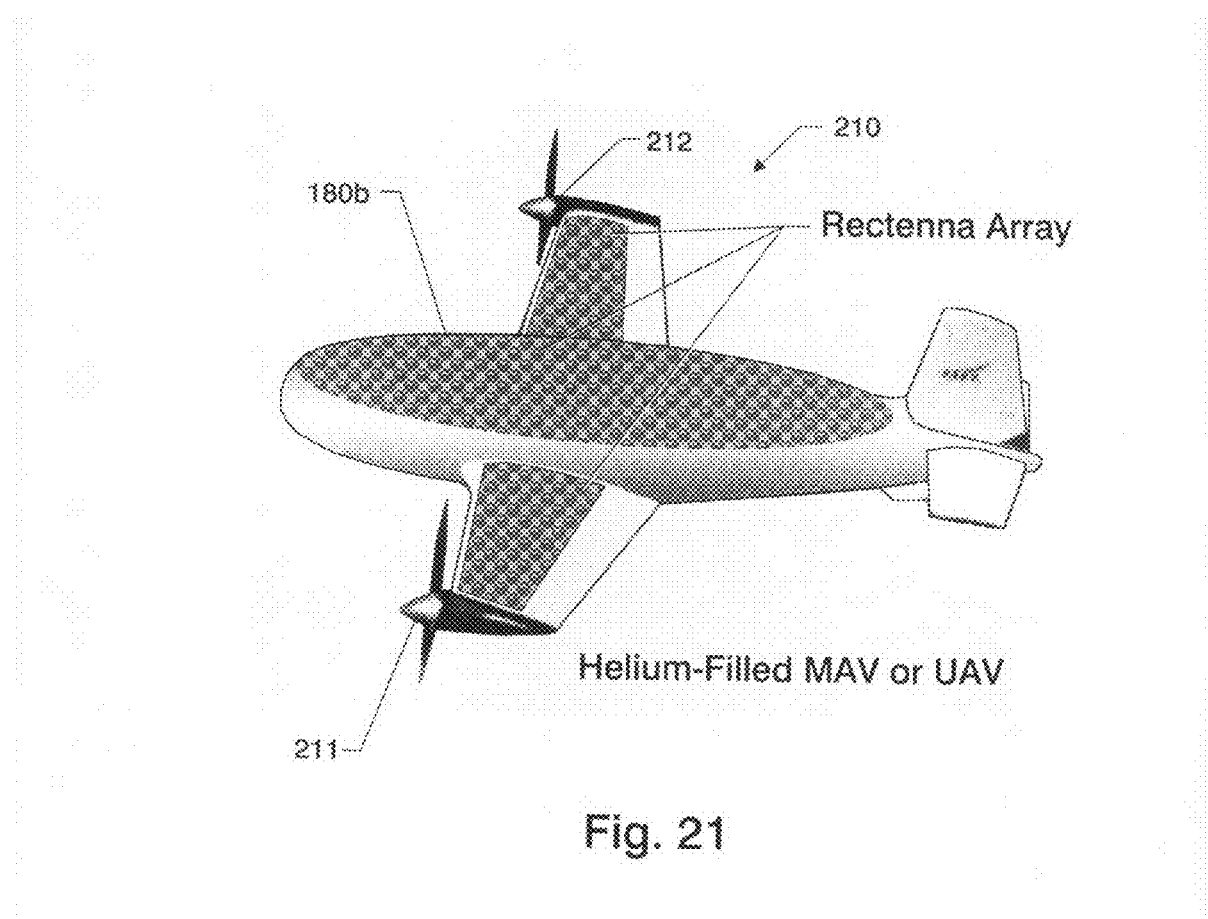
FIG. 21 is a perspective view of a novel unmanned or manned aerial (UAV or MAV) configured for electric propulsion power to be wirelessly transmitted.

Another potential embodiment of the inventive HAA configuration includes a base for UAV or MAV airships. A novel lightweight, high performance, long endurance UAV configuration, as shown in FIG. 21, has been developed that combines a polymer structure with an electrical power generating system to produce new missions and capabilities for air vehicles. As presently envisioned, this class of UAV satisfies aeronautical missions for high altitude, characterized by long endurance, electric propulsion, propellantless, and emissionless. The configuration utilizes a polyimide structural material for creating the primary wing and fuselage elements of the vehicle. The polymer structure functions to carry normal, bending, and pressure loads as experienced from sea-level to cruising altitudes. The polymer structure incorporates arrays of rectennas 180*b* to form a wireless power generation system. The rectenna system 180*b* has been demonstrated at microwave wavelengths (X-Band) to provide 275 volts from 18 milli-Watts of incident energy. The rectenna system 180*b* can be designed for other and higher frequencies depending on configuration requirements, atmospheric transmissibility, etc. The resulting electrical energy can be used as power for electrical motors for propulsion of the UAV's alone, in combination with electrical storage systems, or in combination with other hydrocarbon engines, including hybrid modes of operation.

Figure 14:
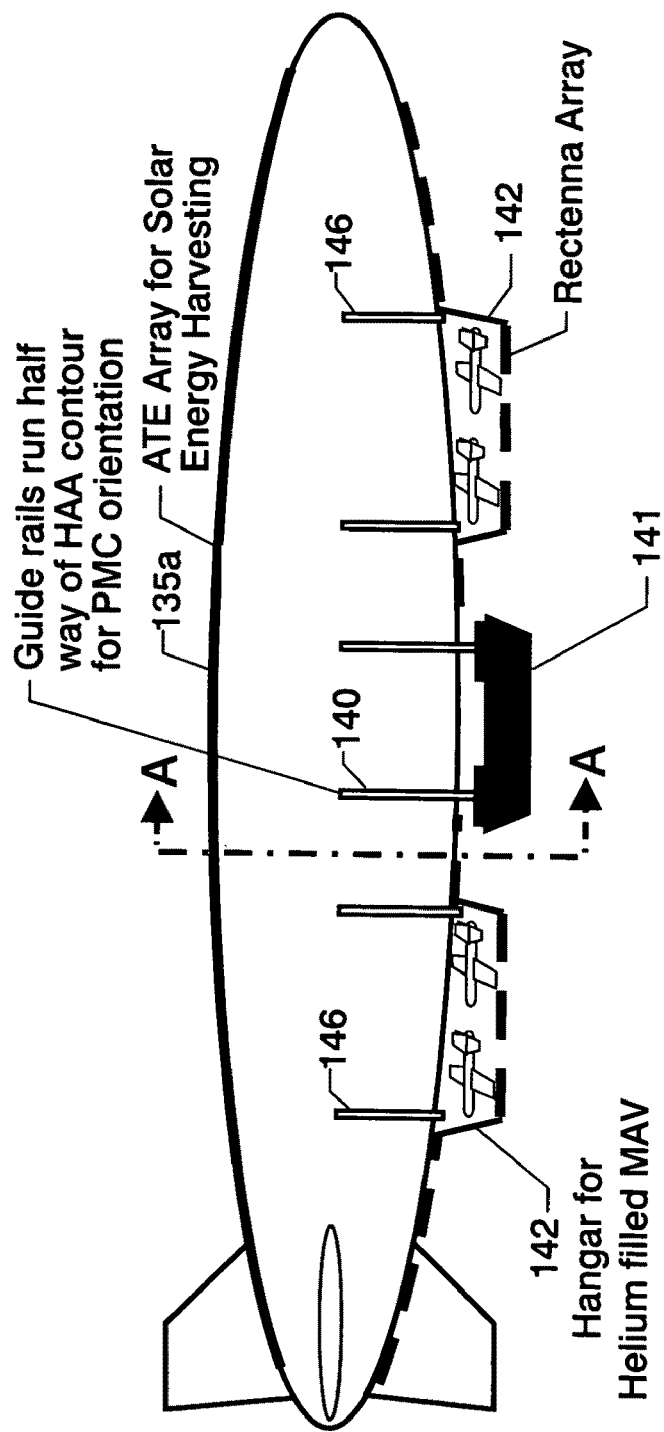
FIG. 14 is a side-view drawing of another embodiment of an HAA of the present invention.

As conceived, the UAV is air-launched from and returned to the HAA base. The HAA base for UAVs is built under the HAA, as shown in FIGS. 14 and 15. The UAVs may also be launched or retrieved by hand, machine, towing, or dropped from other aircraft and/or helicopters. By nature of the structural material and concept of utilization, the UAV does not require landing gear or skids. As such, the structural design requirements for takeoff, landing, and taxiing are reduced or eliminated and thereby relax the overall structural design loads and requirements.

To sustain a long duration operation, the helium or helium/hydrogen mixture filled fat-body airframe of UAVs is considered to reduce the power requirement for propulsion by both reducing the body weight and increasing the lift force by buoyancy. The fat-body framed UAV mode 210 to be propelled by electric motors is shown in FIG. 21. Two electric motor driven propellers 211, 212 are located at both the wing-tips and control the flight direction by changing rotational speed. The power for these planes is obtained from microwave through rectenna arrays 180b that are integrated on the skin of the airframe. The range of maneuver is determined by the envelope of microwave beaming column and the guided direction of beam. As long as any MAVs or UAVs are within the beam column, the power is continuously fed into them.

Suppose that a UAV has a 10 m$^2$ rectenna arrays that are integrated into the skin of fuselage and both wings as shown FIG. 21. If 1 MW of microwave power as described in the block diagram of FIG. 20 is transmitted at w-band, the power flux density of microwave at the ground level will be approximately 60 mW/cm$^2$. The power received by a UAV which is a 20 km away to the ground level and has a 10 m$^2$ rectenna arrays will amount to be 6 kW within the power beam column of 50 meters in diameter. Using the same logic shown in FIG. 19, the power is allocated to the propulsion system and other functional systems, such as probes. Suppose that the maneuver of the UAV requires 4 kW of the received power. The rest can be used for sensors and probes for other operations. However, the power receiving area of MAVs or UAVs is limited due to their own limited sizes. Therefore, they require an extra lifting force to stay aloft. The helium-filled MAV or UAV 210 as shown in FIG. 21 will gain an extra lifting force. The UAV size of 5 m$^3$ helium filled will gain the buoyancy force of 51 N which will reduce the weight by approximately 5 kg.

Figure 22:
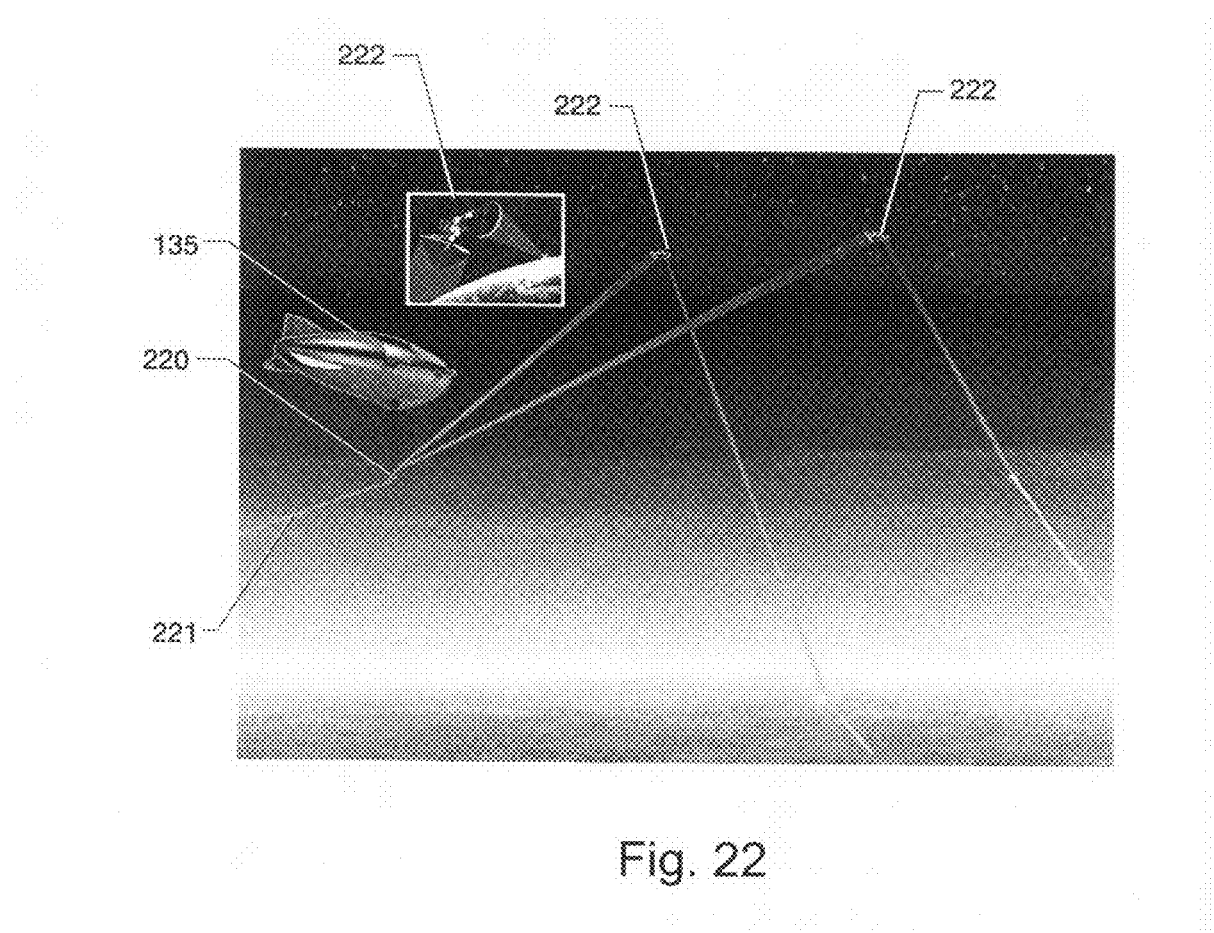
FIG. 22 is an image depicting an HAA utilizing a sophisticated relay system of laser power.

Another scenario for HAA use is for laser power transmission technologies for space applications which were developed in late 1970 through the 1980's using the directly solar pumped iodine laser and also a high power diode laser array. The efficiencies of continuous wave (CW) lasers are, in general, poor, especially for the short wavelength lasers. If we consider a laser with 10% efficiency, the actual laser power to be conveyed through the beam becomes 100 kW level. With a pulse forming network, the laser power output would be much higher to a few tera-watts (TW) level by pulse compression. The reflectors 220 that are installed on a HAA can also be used to relay the laser beam power 221 to selected locations through the relay satellite 222 as shown in FIG. 22. However, if the HAA has sufficient power available from utilization of the ATE conversion device of the present invention, the relay station would not be necessary. Additionally, energy harvested by the ATE device 100/100a can also be used for internal power requirements of the HAA. The internal power requirement is determined from the power consumption by the PMC station movement over the guide rail, communication equipment, and system monitoring devices. Additionally, onboard radar systems can also be operated with this energy. The onboard radar operation can be used for monitoring any flying objects or ground or sea level activities of interest.

The new concept HAA, as described above, has an elliptical cross-section perpendicular to the thrust axis to expand the solar exposure area, unlike the conventional airships with a circular cross-section. FIG. 13B shows the elliptical cross section of an embodiment of the airship. Accordingly, the overall shape of the new concept airship is flattened as illustrated in FIGS. 13A and 15. Although the elliptical cross-section 131 of the airship 135 may be structurally less sturdy or slightly heavier than the circular cross-section, the benefits of the elliptical shape are greater in consideration of the lift force and the stability of flight that might compensate the shortcomings of elliptical cross-section. If the structural reinforcement of the elliptical cross section should be required to maintain the same strength level of a circular cross sectioned, the weight increase due to the elliptical cross section of airship would be less than 20%. The near flat-top surface 135a of the airship 135 offers a wide area to accommodate a energy harvesting device from sun light, such as solar cells or the advanced thermoelectric generators of the present invention. As shown in FIG. 14, the HAA can have guide rail systems 140/146 to locate the PMC station 141 and the UAV hangars 142 to the nadir position of HAA 135. The purpose of rotational capability along the guide rail 140 is to maximize the incidence of solar flux by setting the top surface of HAA 135 always perpendicular to sun light 160. Whenever the PMC station 141 moves on the guide rail 140, the HAA rotates the PMC station 141 and sets the PMC station 141 at the lowest level as shown in FIGS. 14 and 16 since the PMC station 141 is typically the heaviest unit of the HAA. Movement of PMC 141 on guide rail 140 can be accomplished through conventional means (e.g. computer controlled and electric motor driven). Similarly, in at least one embodiment, guide rails 146 can be provided, to move the UAV hangars 142 in the same manner as the PMC station 141.

Although the invention has been described relative to specific embodiments thereof, there are numerous variations and modifications that will be readily apparent to those skilled in the art in light of the above teachings. It is therefore to be understood that, with in the scope of the appended claims, the invention may be practiced other than as specifically described herein.

The invention claimed is:

1. An airship having a substantially flat upper surface and further comprising means for converting solar energy incident thereon and means for maximizing the collection of said solar energy, wherein said means for converting solar energy comprises at least one thermoelectric energy conversion device comprising a plurality of thermoelectric layers, and wherein each such layer is suited for best thermal energy conversion performance within a particular temperature range; wherein said maximizing means comprises troughs, wherein said troughs are configured to collect and concentrate the incident solar energy and focus it onto said means for converting solar energy, wherein said maximizing means further comprises means for reorienting said airship to maintain said substantially flat upper surface oriented substantially perpendicular to the incident solar rays; wherein said airship comprises means for power management and said reorienting means comprises a rail system configured to move said power management means, whereby the position of said power management means is maintained substantially at the nadir point of said airship; wherein said airship further comprises at least one hangar configured for the launching of aerial vehicles, further wherein said rail system comprises means for moving said at least one hangar, whereby the position of said at least one hangar is controlled.

2. The airship of claim 1, wherein said airship is a high altitude airship.

3. The airship of claim 1, wherein each said trough comprises a reflective surface.

4. The airship of claim 1, wherein said power management means is a power management control station positioned on said lower surface of said airship.

5. The airship of claim 1, wherein at least one of said energy conversion devices is positioned along a longitudinal axis of a corresponding trough to receive said concentrated, focused solar energy reflected from said corresponding trough.

6. The airship of claim 1, wherein said plurality of thermoelectric layers comprise one or more layers of nanovoid-embedded semiconductive alloy.

7. The airship of claim 6, wherein said nanovoid-embedded semiconductive alloy is at least one of nanovoid-embedded lead telluride (PbTe) semiconductive alloy and nanovoid-embedded bismuth telluride ($Bi_2Te_3$) semiconductive alloy.

8. The airship of claim 7, wherein said plurality of thermoelectric layers comprise one layer of each of lattice-matched silicon germanium (SiGe) semiconductive alloy, nanovoid-embedded lead telluride (PbTe) semiconductive alloy and nanovoid-embedded bismuth telluride ($Bi_2Te_3$) semiconductive alloy.

9. The airship of claim 1, wherein said position of said at least one hangar is continually maintained at or near the nadir point of said airship.

10. The airship of claim 1, further comprising an array of rectennas disposed on at least one lower surface of said airship, wherein said rectennas are configured to convert microwave energy to electrical energy.

11. The airship of claim 1, further comprising reflector means operatively connected to said airship wherein said reflector means is configured to relay received laser energy to desired locations.

12. The airship of claim 1, further characterized as having an elliptical cross-section.

* * * * *